United States Patent
Hamachi

(10) Patent No.: US 11,930,586 B2
(45) Date of Patent: Mar. 12, 2024

(54) WIRING SUBSTRATE, ELECTRONIC DEVICE AND ELECTRONIC MODULE

(71) Applicant: KYOCERA Corporation, Kyoto (JP)

(72) Inventor: Toshiyuki Hamachi, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/167,216

(22) Filed: Feb. 10, 2023

(65) Prior Publication Data

US 2023/0199937 A1 Jun. 22, 2023

Related U.S. Application Data

(63) Continuation of application No. 17/270,096, filed as application No. PCT/JP2019/033655 on Aug. 28, 2019, now Pat. No. 11,582,858.

(30) Foreign Application Priority Data

Aug. 29, 2018 (JP) .................. 2018-160533
Oct. 30, 2018 (JP) .................. 2018-204113

(51) Int. Cl.
- H05K 1/02 (2006.01)
- H05K 1/18 (2006.01)
- H05K 3/10 (2006.01)

(52) U.S. Cl.
CPC .......... *H05K 1/0209* (2013.01); *H05K 1/184* (2013.01); *H05K 3/103* (2013.01)

(58) Field of Classification Search
CPC .................................. H05K 1/0201–1/0209
See application file for complete search history.

(56) References Cited

U.S. PATENT DOCUMENTS

| 9,209,141 B2 | 12/2015 | Lamorey et al. |
| 2014/0084441 A1* | 3/2014 | Chiu ............... H01L 25/0657 257/692 |

FOREIGN PATENT DOCUMENTS

| JP | 2005-012166 A | 1/2005 |
| JP | 2007-311510 A | 11/2007 |
| JP | 2010-135729 A | 6/2010 |
| JP | 2011-009401 A | 1/2011 |
| JP | 2011-114172 A | 6/2011 |
| JP | 2013-045900 A | 3/2013 |
| JP | 2013-229490 A | 11/2013 |
| JP | 2015-159245 A | 9/2015 |

* cited by examiner

*Primary Examiner* — Jeremy C Norris
(74) *Attorney, Agent, or Firm* — Volpe Koenig

(57) ABSTRACT

A wiring substrate includes: an insulating substrate including a base portion comprising a through hole having a first opening and a second opening, and a frame portion located on the base portion; and a heat dissipator disposed on a side of the base portion that is opposite to the frame portion so as to block the second opening, wherein an inner surface of the through hole faces a side surface of the heat dissipator with a clearance being provided between the inner surface of the through hole and the side surface of the heat dissipator.

19 Claims, 21 Drawing Sheets

US 11,930,586 B2

WIRING SUBSTRATE, ELECTRONIC DEVICE AND ELECTRONIC MODULE

CROSS-REFERENCE TO RELATED APPLICATION

This application is a continuation application of U.S. patent application Ser. No. 17/270,096 filed Feb. 22, 2021, which is a U.S. national stage entry according to 35 U.S.C. 371 of International Application No. PCT/JP2019/033655 filed on Aug. 28, 2019, which claims priority to Japanese Patent Application Nos. 2018-160533 filed on Aug. 29, 2018, and 2018-204113 filed on Oct. 30, 2018, the contents of which are entirely incorporated herein by reference.

TECHNICAL FIELD

The present invention relates to a wiring substrate, an electronic device and an electronic module.

BACKGROUND

Heretofore a wiring substrate constructed of a ceramics-made insulating substrate on a principal surface of which an electronic element is mounted is known.

In the wiring substrate just described, a recess for receiving and mounting an electronic element is provided in an upper surface of the insulating substrate. The wiring substrate includes wiring conductors disposed on a surface and in an interior of the insulating substrate (refer to Japanese Unexamined Patent Publication JP-A 2015-159245).

SUMMARY

A wiring substrate according to the present disclosure includes: an insulating substrate including a base portion including a through hole having a first opening and a second opening, and a frame portion located on the base portion; and a heat dissipator disposed on a side of the base portion that is opposite to the frame portion so as to block the second opening, wherein an inner surface of the through hole faces a side surface of the heat dissipator with a clearance being provided between the inner surface of the through hole and the side surface of the heat dissipator.

An electronic device according to the disclosure includes: the wiring substrate mentioned above; and an electronic element mounted on the wiring substrate.

An electronic module according to the disclosure includes: the electronic device mentioned above; and a module substrate to which the electronic device is connected.

DETAILED DESCRIPTION

Figure 1A:
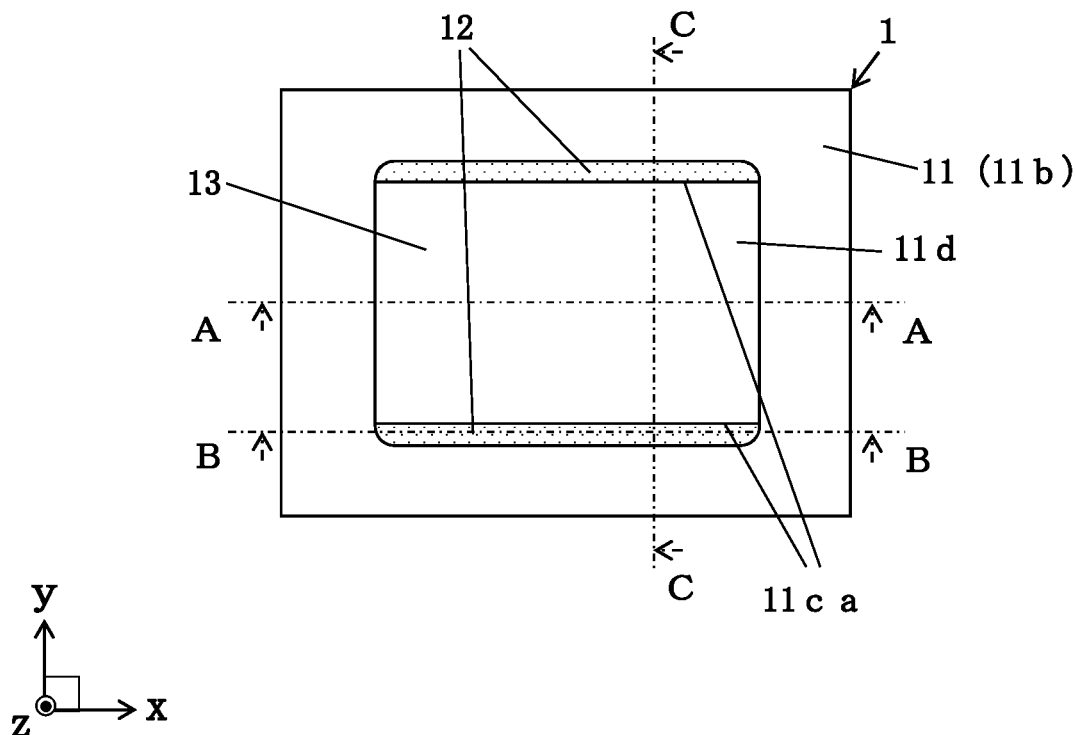
FIG. 1A is a top plan view showing a wiring substrate according to a first embodiment.
Figure 1B:
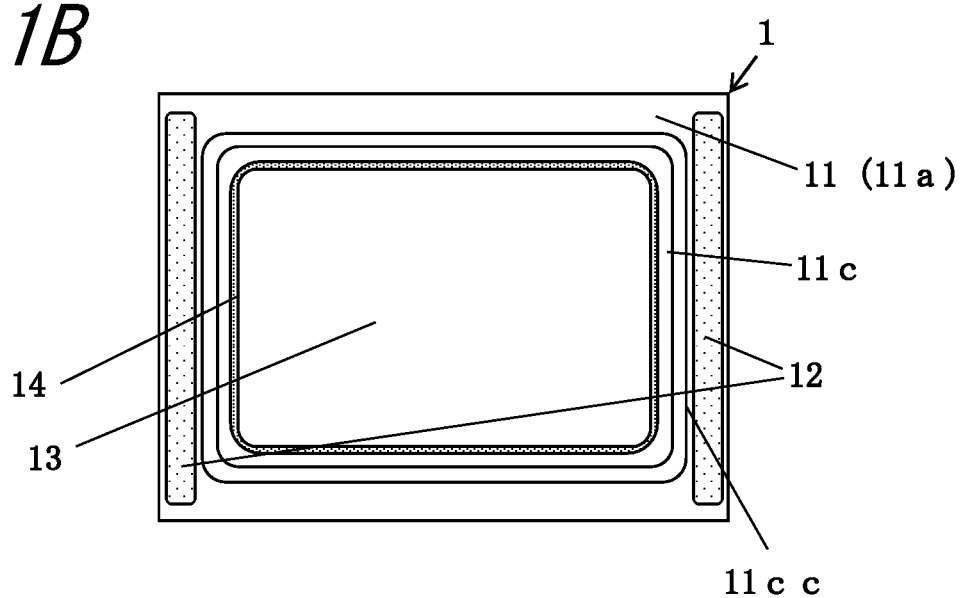
FIG. 1B is a bottom plan view of the wiring substrate shown in FIG. 1A.

Several exemplary embodiments of the disclosure will now be described with reference to the accompanying drawings.

First Embodiment

As in an example shown in FIGS. 1A to 4B, a wiring substrate 1 according to a first embodiment includes: an insulating substrate 11 including a base portion 11a and a frame portion 11b; and a heat dissipator 13. An electronic device includes: the wiring substrate 1; and an electronic element 2 mounted on a mounting portion of the wiring substrate 1. For example, the electronic device is connected via a joining material to a connection pad disposed on a module substrate constituting an electronic module.

In this embodiment, the wiring substrate 1 includes: the insulating substrate 11 including the base portion 11a including a through hole 11c with a first opening 11ca and a second opening 11cb, and the frame portion 11b located on the base portion 11a; and the heat dissipator 13 disposed on a side of the base portion 11a which is opposite to the frame portion 11b so as to block the second opening 11cb. An inner surface of the through hole 11c faces a side surface of the heat dissipator 13 with and the clearance is provided between the inner surface of the through hole 11c and the side surface of the heat dissipator 13. In FIGS. 1A to 4B, an upward direction conforms to a positive direction along an imaginary z axis. Although two opposite sides of the construction in a vertical direction are designated as the "upper" and "lower" surfaces in the following description, this designation is used just for explanatory convenience and does not apply with respect to the wiring substrate 1 and others in actual operating conditions.

Figure 2A:
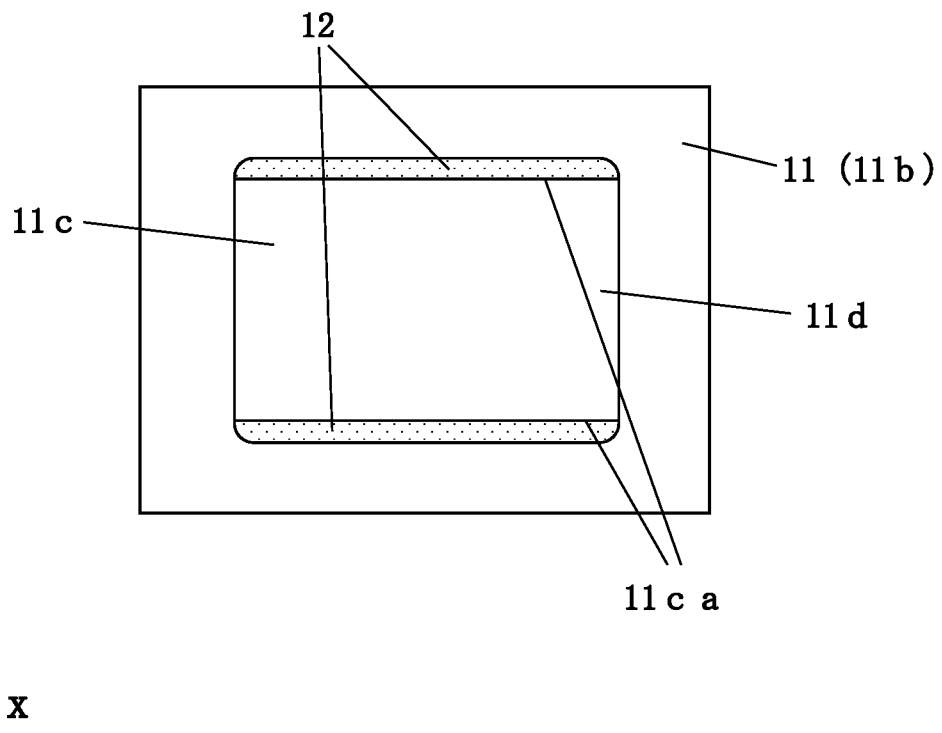
FIG. 2A is a top plan view showing an insulating substrate of the wiring substrate shown in FIGS. 1A and 1B.
Figure 2B:
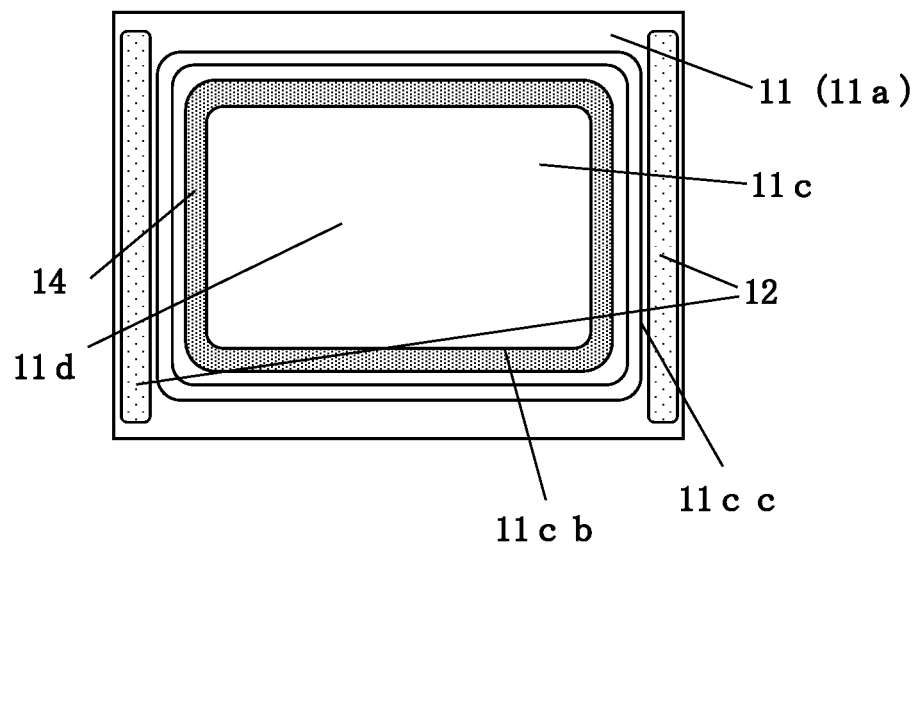
FIG. 2B is a bottom plan view of the insulating substrate shown in FIG. 2A.

A plurality of wiring conductors 12 are provided in the base portion 11a. In the example shown in FIGS. 1A, 1B, 2A, 2B, and 4A, each wiring conductor 12 is indicated by a shaded area. Also provided is a connection conductor 14 which is indicated by a shaded area in the example shown in FIGS. 1B and 2B. FIGS. 2A and 2B show top and bottom plan views of the insulating substrate 11 of the wiring substrate 1, with the heat dissipator 13 removed.

The insulating substrate 11 includes one principal surface (upper surface as viewed in FIGS. 1A to 4B), the other principal surface (lower surface as viewed in FIGS. 1A to 4B) opposed to the one principal surface, and side surfaces. The insulating substrate 11 includes: the base portion 11a including the through hole 11c; and the frame portion 11b, which includes a second through hole 11d, located on the base portion 11a. In a plan view, the through hole 11c of the base portion 11a overlaps the second through hole 11d of the frame portion 11b, that is; the insulating substrate 11 includes a hole penetrating therethrough from the one principal surface to the other principal surface, as viewed in the plan view.

As in the example shown in FIGS. 1A to 4B, the base portion 11a is stepped to provide a shoulder, located within the through hole 11c, for connection with the upper surface of the heat dissipator 13. The frame portion 11b is located on the upper surface of the base portion 11a. The base portion 11a or the frame portion 11b is formed of a single-ply insulating layer or a plurality of insulating layers, and the insulating substrate 11 includes a plurality of insulating layers accordingly. The insulating substrate 11 has the form of a quadrangular plate when viewed in the plan view, that is; when viewed from a direction perpendicular to the principal surface. The insulating substrate 11 serves as a support for supporting the heat dissipator 13 and the electronic element 2.

The insulating substrate 11 (the base portion 11a and the frame portion 11b) may be made of ceramics, e.g. an aluminum oxide sintered body (alumina ceramics), an aluminum nitride sintered body, a silicon nitride sintered body, a mullite sintered body, or a glass ceramics sintered body. For example, if using an aluminum oxide sintered body for the insulating substrate 11, the insulating substrate 11 is produced by preparing a slurry by admixing suitable organic binder, solvent, etc. in powder of raw materials such as aluminum oxide ($Al_2O_3$), silicon oxide ($SiO_2$), magnesium oxide (MgO), and calcium oxide (CaO); shaping the resulting slurry into a sheet by using heretofore known means such as a doctor blade method or a calender roll method to obtain a ceramic green sheet; subjecting the resulting ceramic green sheet to a suitable punching process; laminating a plurality of ceramic green sheets into a green body; and firing the resulting green body at a high temperature (about 1600° C.).

As in the example shown in FIGS. 1A to 3C, the through hole 11c is located in the base portion 11a. The through hole 11c receives the heat dissipator 13. As in the example shown in FIGS. 1A and 1B, the through hole 11c, which has a quadrangular form having arcuately rounded corners as viewed in the plan view, is located at the center of the base portion 11a. As in the example shown in FIGS. 1A to 3C, the base portion 11a is formed of a three-ply insulating layer.

As in the example shown in FIGS. 1A to 3C, the second through hole 11d is located in the frame portion 11b. The second through hole 11d, which has a quadrangular form having arcuately rounded corners as viewed in the plan view, is located at the center of the frame portion 11b. In the plan view, the through hole 11c and the second through hole 11d overlap each other. The through hole 11c includes the first opening 11ca, which is a frame portion 11b-side opening. The second through hole 11d serves, in conjunction with the base portion 11a and the heat dissipator 13, to accommodate the electronic element 2. As in the example shown in FIGS. 1A to 3C, the frame portion 11b is formed of a single-ply insulating layer.

For example, the through hole 11c is obtained by forming a through hole which constitutes the through hole 11c of the base portion 11a in each of base portion 11a-forming ceramic green sheets through a hole-boring process such as lasering or punching using a punch die. Moreover, for example, the second through hole 11d is obtained by forming a through hole which constitutes the second through hole 11d of the frame portion 11b in each of frame portion 11b-forming ceramic green sheets through a hole-boring process such as lasering or punching using a punch die. The base portion 11a-forming ceramic green sheet and the frame portion 11b-forming ceramic green sheet are laminated together so that the through hole for constituting the through hole 11c and the through hole for constituting the second through hole 11d can overlap each other. Consequently, in the plan view, the through hole 11c of the base portion 11a is brought into communication with the second through hole 11d of the frame portion 11b, and the insulating substrate 11 includes a hole penetrating therethrough from the one principal surface to the other principal surface accordingly.

The wiring conductor 12 is provided on the surface and in the interior of the insulating substrate 11. The wiring conductor 12 includes: a wiring layer located on the surface of the insulating layer; and a through conductor formed so as to pass through the insulating layer in a thickness direction thereof for connection to the wiring layer. The wiring conductor 12 provides electrical connection between the electronic element 2 and the module substrate. As in the example shown in FIGS. 1A to 3C, the wiring conductor 12 is located on the upper and lower surfaces, and also in the interior, of the base portion 11a. As in the example shown in FIGS. 1A to 4B, the wiring conductor 12 includes one end led out to the upper surface of the shoulder of the base portion 11a, and includes the other end led out to the lower surface of the base portion 11a.

The wiring conductor 12 is made by metallization from metallic powder predominantly composed of tungsten (w), molybdenum (Mo), manganese (Mn), silver (Ag), or copper (Cu), for example. For example, in the case where the insulating substrate 11 is made of an aluminum oxide sintered body, a metallization paste is prepared by admixing suitable organic binder, solvent, etc. in high-melting-point metal powder such as W, Mo, or Mn. The metallization paste is applied, in a predetermined pattern, to a ceramic green sheet for forming the insulating substrate 11 by printing using screen printing method, and then the paste and the insulating substrate 11-forming ceramic green sheet are fired at one time. The wiring conductor 12 is thus formed by deposition in predetermined locations of the insulating substrate 11. In the case of forming the wiring layer of the wiring conductor 12, for example, a metallization paste for forming the wiring layer is applied to the insulating substrate 11-forming ceramic green sheet by printing using printing means such as the screen printing method, and then the paste and the insulating substrate 11-forming ceramic green sheet are fired at one time. In the case of forming the through conductor of the wiring conductor 12, for example, the insulating substrate 11-forming ceramic green sheet is provided with a through hole for receiving the through conductor by hole-boring operation, e.g. punching using a punching die or a punch, or lasering, and, a metallization paste for forming the through conductor is applied so as to fill the described through hole by printing means as above described. after that, the paste and the insulating substrate 11-forming ceramic green sheet are fired at one time. The metallization paste is prepared by kneading the above-described metallic powder with suitable solvent and binder while adjusting the viscosity of the mixture to an adequate level. In the interest of strengthening of bonding with the insulating substrate 11, the metallization paste may contain glass powder and ceramic powder.

The heat dissipator 13 includes one principal surface (upper surface as viewed in FIGS. 1A to 4B), the other principal surface (lower surface as viewed in FIGS. 1A to 4B) opposed to the one principal surface, and side surfaces. The heat dissipator 13 is, as in the example shown in FIGS. 1A to 4B, quadrangular in plan configuration. An upper part of the heat dissipator 13 is received in the through hole 11c of the base portion 11a, and an outer periphery of the heat dissipator 13 is joined to the lower surface of the shoulder of the base portion 11a. The through hole 11c includes the second opening 11cb located on the shoulder side of the base portion 11a, and also includes a third opening 11cc located opposite to the first opening 11ca. The heat dissipator 13 includes an upper surface serving as a mounting face for the mounting of the electronic element 2, and hence serves as a support for supporting the electronic element 2.

The heat dissipator 13 is made of a material which is higher in thermal conductivity than the base portion 11a, e.g. a metal material such as copper (Cu), copper-tungsten (Cu—W), or aluminum (Al), or a ceramic material such as an aluminum oxide sintered body, a mullite sintered body, an aluminum nitride sintered body, or a silicon carbide sintered body. For example, if using an aluminum oxide sintered body as the material of construction of the base portion 11a, the heat dissipator 13 may be made of Cu. The use of such a material which is higher in thermal conductivity than the base portion 11a for the heat dissipator 13 enables the heat dissipator 13 to satisfactorily dissipate heat liberated by the electronic element 2 mounted on the mounting face of the heat dissipator 13, thus enabling the wiring substrate 1 to deliver good heat dissipation performance. Moreover, the joining of the lower surface of the heat dissipator 13 to, for example, a conductor of the module substrate enhances the heat dissipation performance of the electronic device.

In the case where the heat dissipator 13 is made of a metal material, e.g. Cu, for connection between the heat dissipator 13 and the shoulder of the base portion 11a, for example, the base portion 11a is provided, at the shoulder which is brought into contact with the heat dissipator 13, with a connection conductor 14 via which the connection is made with a joining material such as a Ag—Cu brazing filler metal (not shown). The connection conductor 14 is disposed on the lower-surface side of the shoulder, or equivalently disposed along the edge of the through hole 11c. For example, as in the example shown in FIG. 2B, the connection conductor 14 has a frame form as viewed in the plan view, and, with a joining material, the heat dissipator 13 and the connection conductor 14 are joined together into a framed body. The connection conductor 14 may be formed by using the same material and forming method as those used for the formation of the wiring conductor 12 as described earlier.

Figure 3A:
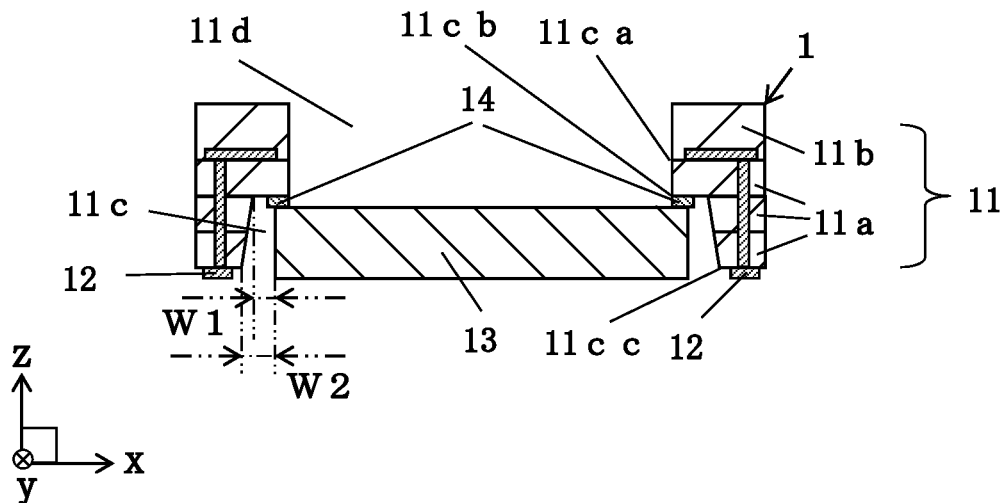
FIG. 3A is a sectional view of the wiring substrate taken along the line A-A shown in FIG. 1A.
Figure 3B:
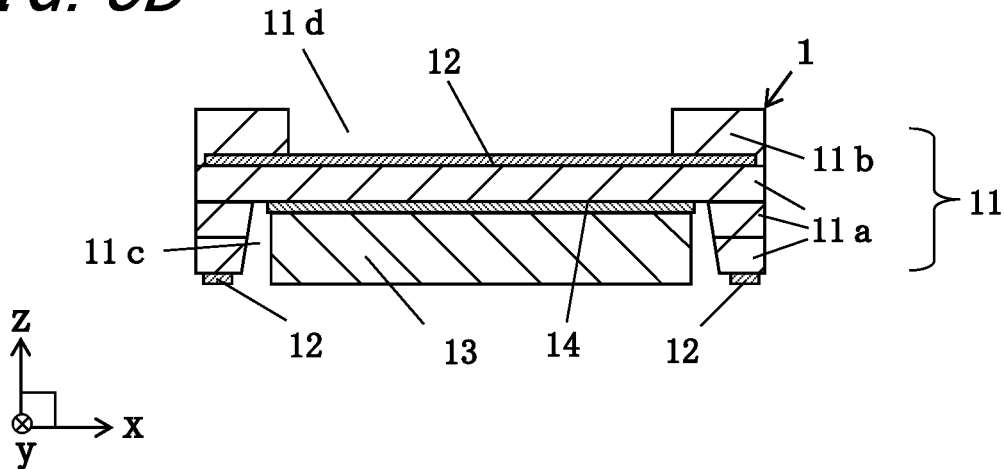
FIG. 3B is a sectional view of the wiring substrate taken along the line B-B shown in FIG. 1A.
Figure 3C:
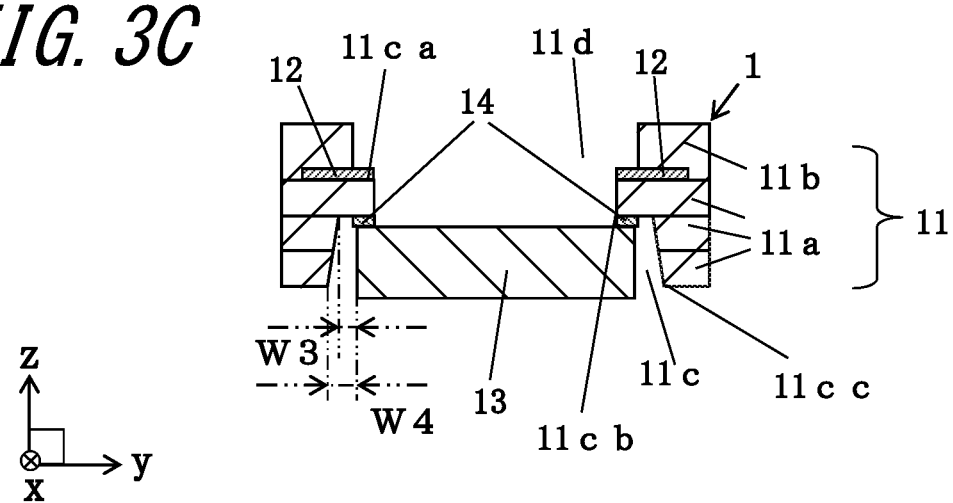
FIG. 3C is a sectional view of the wiring substrate taken along the line C-C shown in FIG. 1A.
Figure 4A:
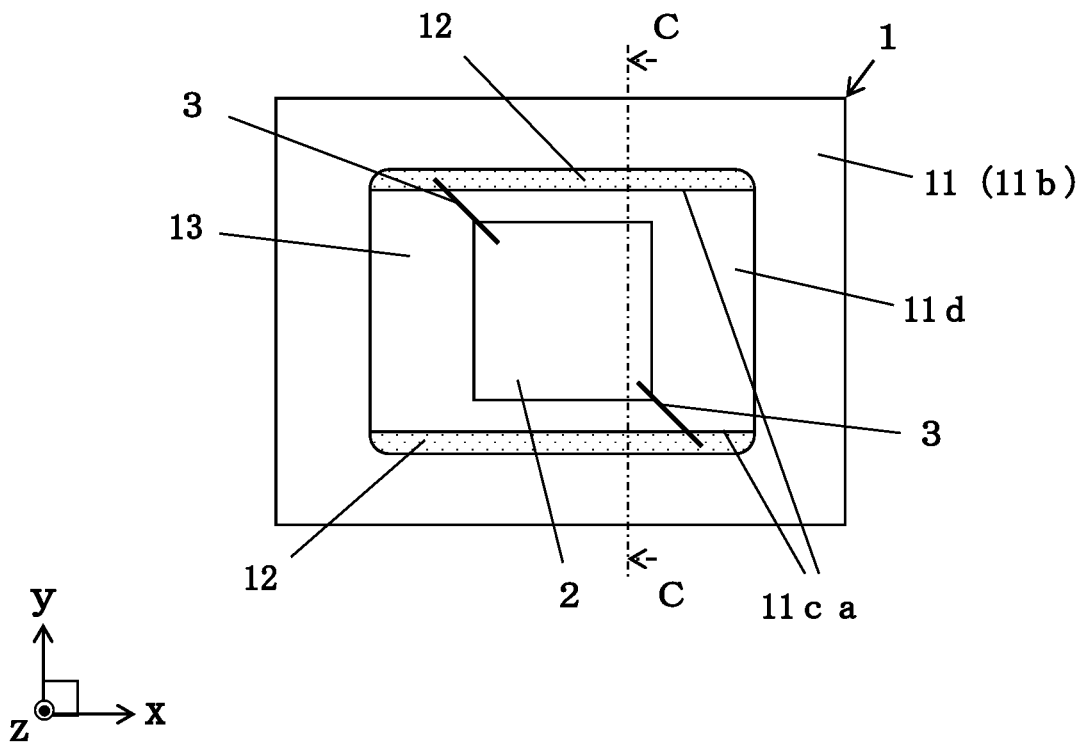
FIG. 4A is a top plan view of an electronic device in which an electronic element is mounted on the wiring substrate shown in FIGS. 1A and 1B.
Figure 4B:
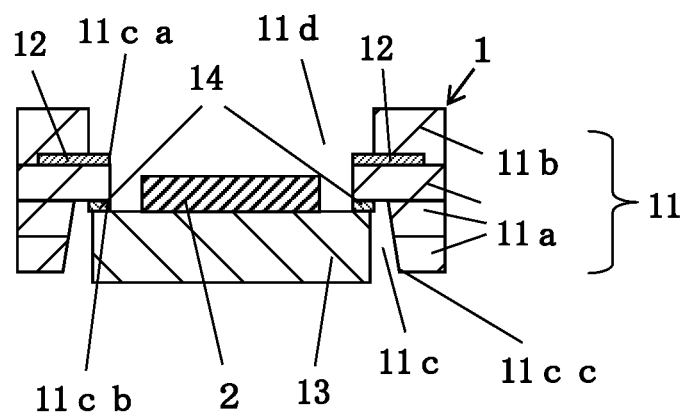
FIG. 4B is a sectional view taken along the line C-C of FIG. 4A.

As in the example shown in FIGS. 3A to 3C, in a vertical sectional view, clearance (W1, W2, W3, W4) between the inner surface of the through hole 11c and the side surface of the heat dissipator 13 is wider in the vicinity of the third opening 11cc than in the vicinity of the frame portion 11b (W1<W2, W3<W4). That is, as in the example shown in FIGS. 1A to 3C, the heat dissipator 13-facing inner surface of the through hole 11c is inclined so that the through hole becomes wider in the vicinity of the third opening 11cc than in the vicinity of the frame portion 11b. This allows the clearance to be wider in the vicinity of the third opening 11cc than in the vicinity of the frame portion 11b.

A metallic plating layer is deposited on the surface of the wiring conductor 12 exposed on the insulating substrate 11 by electrolytic deposition or electroless deposition. The metallic plating layer is made of metal which is highly resistant to corrosion and excels in connectability, e.g. nickel, copper, gold, or silver. As the metallic plating layer, for example, a nickel plating layer with a thickness of 0.5 to 5 μm and a gold plating layer with a thickness of 0.1 to 3 μm are deposited one after another on the exposed surface. This makes it possible to retard corrosion in the wiring conductor 12 effectively, and also strengthen the connection between the wiring conductor 12 and a connecting member 3 such as a bonding wire, as well as the connection between the wiring conductor 12 and a connection pad disposed for connection purposes on the module substrate.

Note that the metallic plating layer is not limited to the nickel plating layer/gold plating layer form, but may be made in other form such as a nickel plating layer/palladium plating layer/gold plating layer form.

The electronic device can be produced by mounting the electronic element 2 on the mounting face of the heat dissipator 13 of the wiring substrate 1. Examples of the electronic element 2 which is mounted on the wiring substrate 1 include: a semiconductor device such as an IC chip or LSI chip; an image pickup device of CCD (Charge Coupled Device) type, CMOS (Complementary Metal Oxide Semiconductor) type or the like; a light-emitting element such as LD (Laser Diode) or LED (Light Emitting Diode); and a light-receiving element such as PD (Photo Diode). The electronic element 2 is secured to the mounting face of the heat dissipator 13 via a joining member such as a low-melting-point brazing filler metal or an electrically conductive resin, and an electrode of the electronic element 2 is then electrically connected to the wiring conductor 12 via the connecting member 3 such as a bonding wire.

Note that a plurality of electronic elements 2 may be mounted on the mounting face of the heat dissipator 13 of the wiring substrate 1, and also, an electronic component of miniature size such as a resistive element or a capacitive element, or other components such as a mirror may be mounted on the mounting face as required. Moreover, on an as needed basis, the electronic element 2 is enclosed with a sealing material made of resin or glass for example, or a lid or the like made of resin, glass, ceramics, or metal for example.

For example, the wiring conductor 12 of the electronic device according to this embodiment is connected to the connection pad of the module substrate via solder, thus constituting the electronic module. In the electronic device, the wiring conductor 12 located on the lower surface of the wiring substrate 1 is connected to the connection pad of the module substrate.

The wiring substrate 1 according to this embodiment includes: the insulating substrate 11 including the base portion 11a including the through hole 11c with the first opening 11ca and the second opening 11cb, and the frame portion 11b located on the base portion 11a; and the heat dissipator 13 disposed on a side of the base portion 11a which is opposite to the frame portion 11b so as to block the second opening 11cb. The inner surface of the through hole 11c faces the side surface of the heat dissipator 13 with the clearance being provided between the inner surface of the through hole 11c and the side surface of the heat dissipator 13. In this construction, the base portion 11a and the heat dissipator 13 can be joined together, the heat dissipator 13 can dissipate heat transmitted from the electronic element 2 mounted on the mounting face of the heat dissipator 13 properly through the lower surface and side surfaces of the heat dissipator 13, and the electronic element 2 mounted on the mounting face of the heat dissipator 13 can operate satisfactorily for long periods of time.

Moreover, in the case where the electronic element 2 is a light-emitting element, the wiring substrate may be built as a compact light-emitting device-specific wiring substrate capable of emitting light satisfactorily for long periods of time.

The through hole 11c includes the third opening 11cc located opposite to the first opening 11ca, and, in a vertical sectional view, the clearance W (W1, W2, W3, W4) between the inner surface of the through hole 11c and the side surface of the heat dissipator 13 is wider in the vicinity of the third opening 11cc than in the vicinity of the frame portion 11b. In this case, the base portion 11a and the heat dissipator 13 can be joined together, the heat dissipator 13 can dissipate heat transmitted from the electronic element 2 mounted on the mounting face of the heat dissipator 13 more properly through the lower surface and side surfaces of the heat dissipator 13, and the electronic element 2 mounted on the mounting face of the heat dissipator 13 can operate more satisfactorily for long periods of time.

As in the example shown in FIGS. 1A to 3C, the inner surface of the through hole 11c facing the side surfaces of the heat dissipator 13 is inclined so that the diameter of the through hole 11c increases gradually with increasing distance from the frame portion 11b. In this case, the heat dissipator 13 can dissipate heat transmitted from the electronic element 2 mounted on the mounting face of the heat dissipator 13 properly through the side surfaces thereof, and the electronic element 2 mounted on the mounting face of the heat dissipator 13 can operate satisfactorily for long periods of time.

As in the example shown in FIGS. 1A to 3C, the clearance W (W1, W2, W3, W4) between the inner surface of the through hole 11c and the side surface of the heat dissipator 13 is wider in the vicinity of the third opening 11cc than in the vicinity of the frame portion 11b throughout the circumference around the second opening 11cb at the shoulder in the through hole 11c (W1<W2, W3<W4). In this case, the heat dissipator 13 can dissipate heat properly through all around the side surfaces thereof, and the electronic element 2 mounted on the mounting face of the heat dissipator 13 can operate satisfactorily for long periods of time.

As in the example shown in FIG. 2B, the connection conductor 14 is disposed so as to extend circumferentially around the second opening 11cb at the shoulder in the through hole 11c. In this case, as heat transmitted from the electronic element 2 mounted on the mounting face of the heat dissipator 13 is dissipated through the lower surface and side surfaces of the heat dissipator 13, the heat is partly transmitted to the shoulder in the through hole 11c. This makes it possible to reduce the occurrence of distortion in the insulating substrate 11 or the heat dissipator 13, and thereby enables the electronic element 2 mounted on the mounting face of the heat dissipator 13 to operate satisfactorily for long periods of time.

The electronic device includes the wiring substrate 1 having the above-described structure and the electronic element 2 mounted on the wiring substrate 1, and may thus be built as a compact and high-performance electronic device which remains reliable for long periods of time.

The electronic module includes the electronic device having the above-described structure and the module substrate to which the electronic device is connected, and hence remains reliable for long periods of time.

Second Embodiment

The following describes a wiring substrate 1 according to a second embodiment with reference to FIGS. 5A to 7C.

The wiring substrate 1 according to the second embodiment differs from the wiring substrate 1 according to the preceding embodiment in that, in a transparent plan view, the heat dissipator 13 includes a stepped portion.

Figure 5A:
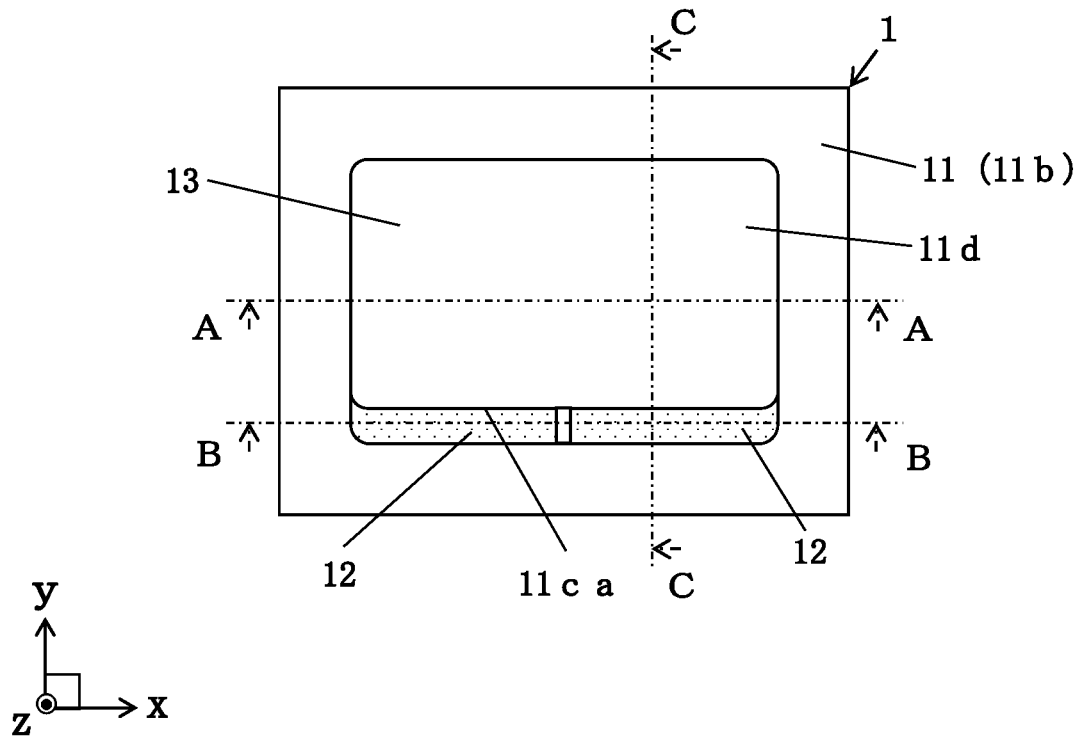
FIG. 5A is a top plan view showing a wiring substrate according to a second embodiment.
Figure 5B:
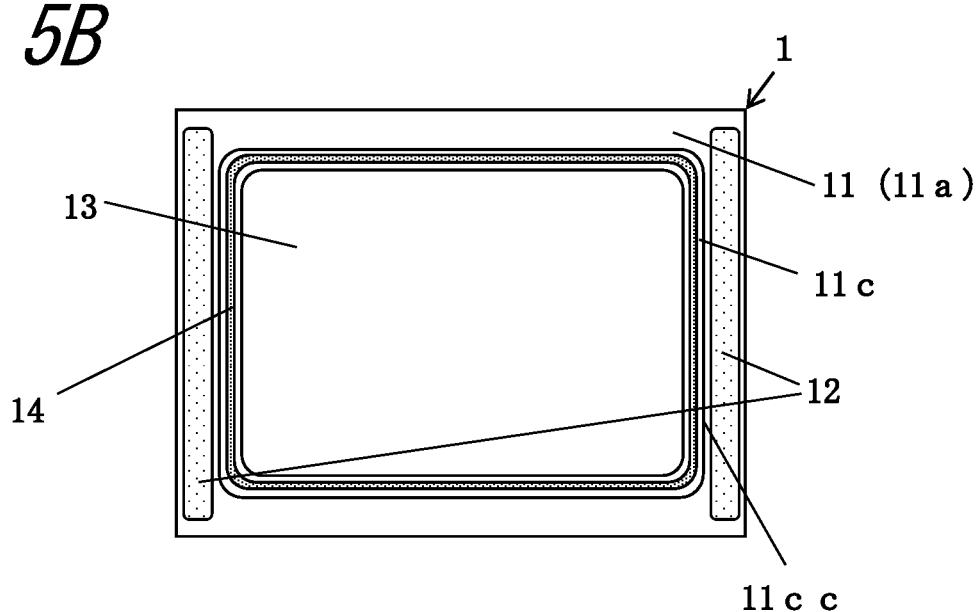
FIG. 5B is a bottom plan view of the wiring substrate shown in FIG. 5A.
Figure 6A:
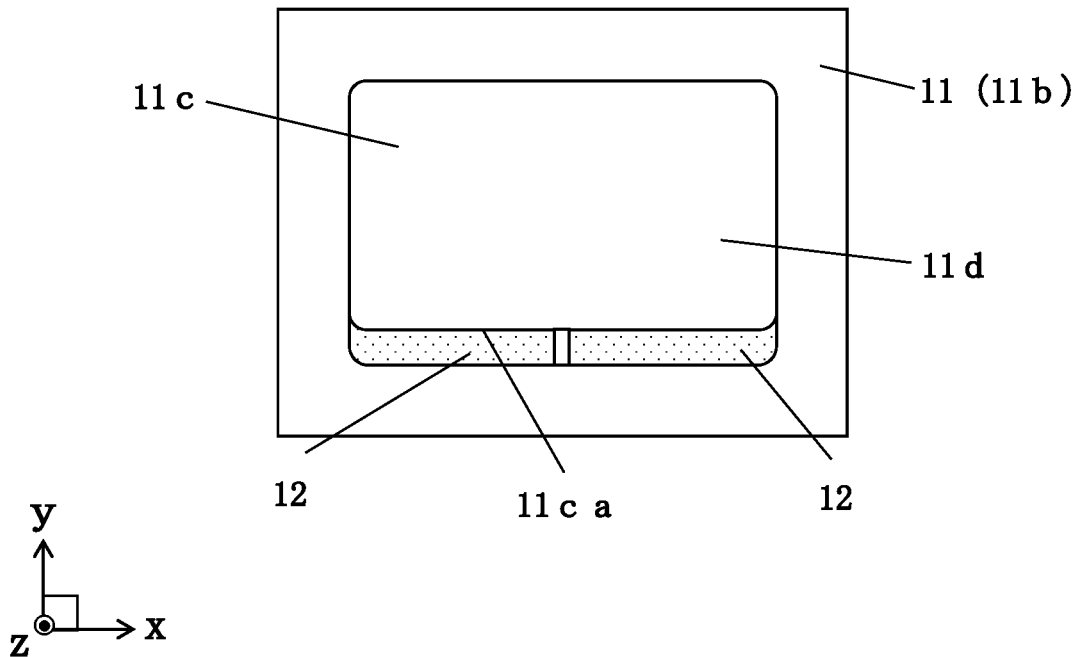
FIG. 6A is a top plan view showing an insulating substrate of the wiring substrate shown in FIGS. 5A and 5B.
Figure 6B:
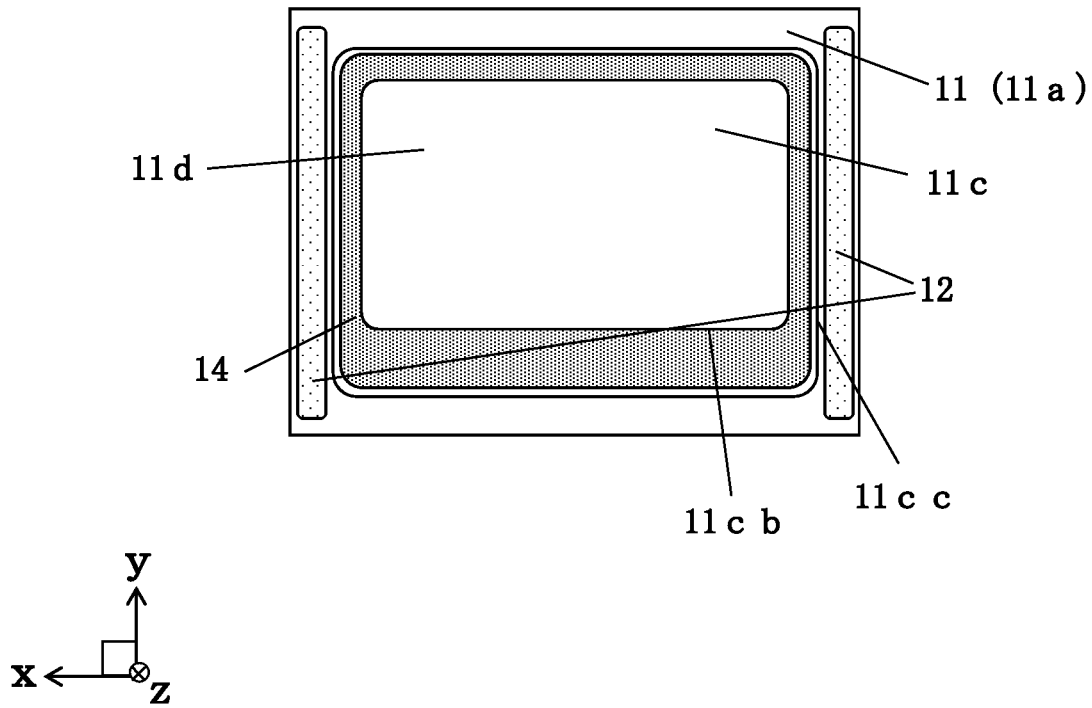
FIG. 6B is a bottom plan view of the insulating substrate shown in FIG. 6A.
Figure 7A:
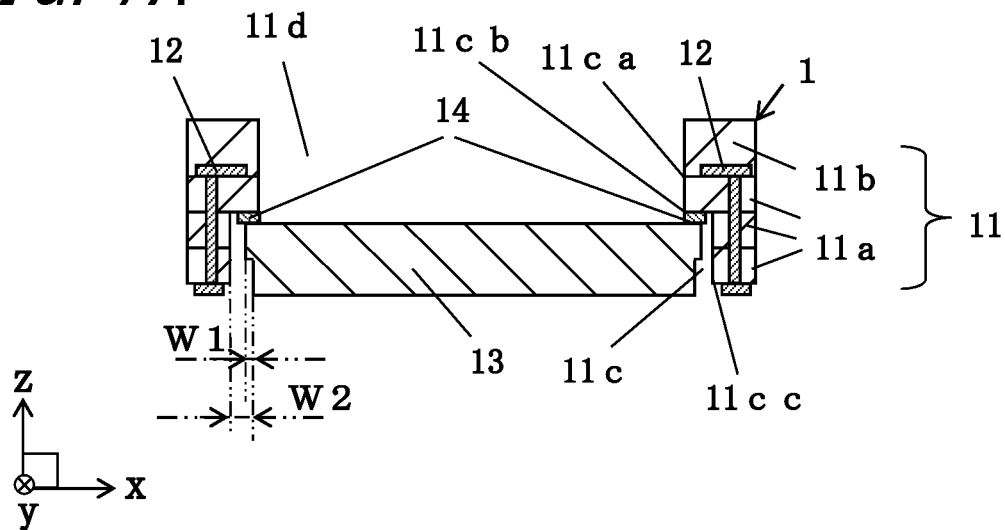
FIG. 7A is a sectional view of the wiring substrate taken along the line A-A shown in FIG. 5A.
Figure 7B:
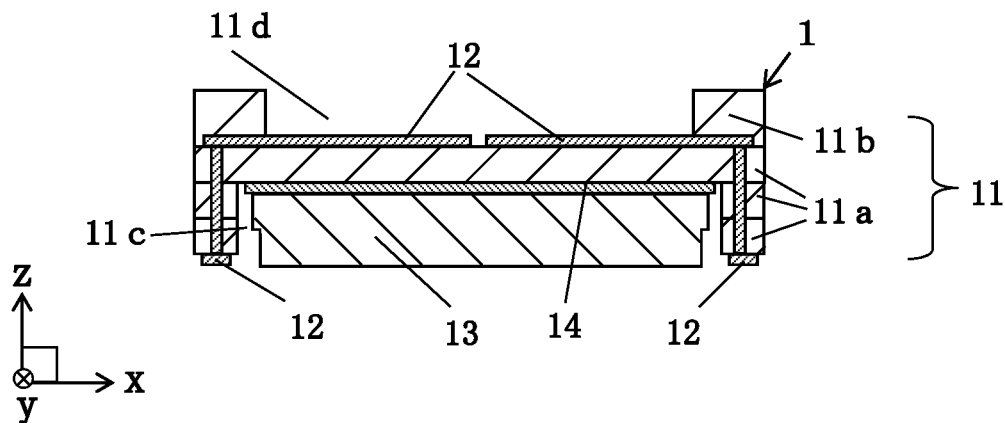
FIG. 7B is a sectional view of the wiring substrate taken along the line B-B shown in FIG. 5A.
Figure 7C:
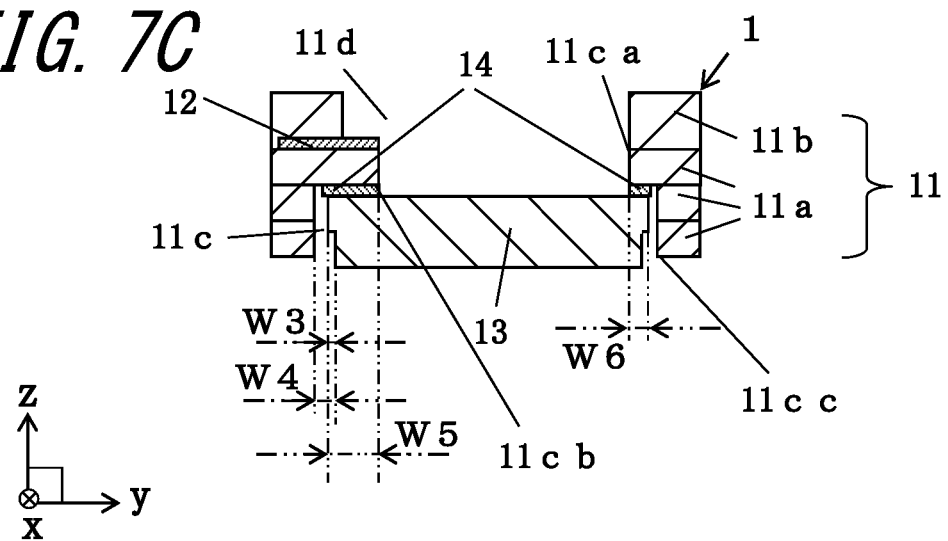
FIG. 7C is a sectional view of the wiring substrate taken along the line C-C shown in FIG. 5A.

In an example shown in FIGS. 5A to 6B, the wiring conductor 12 is indicated by a shaded area. In the example shown in FIGS. 5B and 6B, the connection conductor 14 is indicated by a shaded area. FIGS. 6A and 6B show top and bottom plan views of the insulating substrate 11 of the wiring substrate 1, with the heat dissipator 13 removed.

In the wiring substrate 1 according to the second embodiment, as in the example shown in FIGS. 5A, 5B and 7A to 7C, the side surfaces of the heat dissipator 13 facing the inner surface of the through hole 11c are stepped to provide a second shoulder, whereby the width of the heat dissipator 13 decreases with distance from the frame portion 11b. This allows the clearance between the inner surface of the through hole 11c and the side surface of the heat dissipator 13 to be wider in the vicinity of the third opening 11cc than in the vicinity of the frame portion 11b (W1<W2, W3<W4).

In the wiring substrate 1 according to the second embodiment, as in the wiring substrate 1 according to the preceding embodiment, the base portion 11a and the heat dissipator 13 can be joined together, the heat dissipator 13 can dissipate heat transmitted from the electronic element 2 mounted on the mounting face of the heat dissipator 13 properly through the lower surface and side surfaces of the heat dissipator 13, and the electronic element 2 mounted on the mounting face of the heat dissipator 13 can operate satisfactorily for long periods of time.

Moreover, in the case where the electronic element 2 is a light-emitting element, the wiring substrate may be built as a compact light-emitting device-specific wiring substrate capable of emitting light satisfactorily for long periods of time.

Moreover, the formation of the second shoulder in the heat dissipator 13 makes it possible to reduce the concentration of a stress on the juncture of the shoulder of the base portion 11a and the heat dissipator 13 during long-duration operation of the electronic element 2, and thereby minimize the chance that the base portion 11a and the heat dissipator 13 may become detached from each other.

Moreover, as in the example shown in FIGS. 5A to 7C, in the transparent plan view, the wiring conductors 12 located on the base portion 11a are biasedly located on one edge side of the through hole 11c. In this case, as compared to a case where the wiring conductors 12 are located on each edge side of the through hole 11c, the wiring substrate 1 can be made more compact.

Moreover, in the transparent plan view, the outermost side surface of the heat dissipator 13 connected to the connection conductor 14 is located outside the inner surface of the second through hole 11d of the frame portion 11b. In this case, an entire shoulder lying in the through hole 11c of the base portion 11a is joined to the heat dissipator 13, and thus the heat dissipator 13 dissipates heat transmitted from the electronic element 2 mounted on the mounting face of the heat dissipator 13 properly through the lower surface and side surfaces of the heat dissipator 13, distortion of the region around the shoulder in the through hole 11c is suppressed, and the electronic element 2 mounted on the mounting face of the heat dissipator 13 can operate satisfactorily for long periods of time.

As in the example shown in FIGS. 5A to 6B, the connection conductor 14 is biasedly widened on one edge side of the shoulder lying within the through hole 11c, and, in the transparent plan view, a width W5 of a part of the heat dissipator 13 joined to the base portion 11a on the side where the wiring conductor 12 is placed is greater than a width W6 of a part of the heat dissipator 13 joined to the base portion 11a on the opposite side (W5>W6). In this case, even if a local increase in heat liberation from the wiring conductor 12 occurs due to the one-sided offset pattern of the connection conductor 14 on the base portion 11a, heat is transmitted greatly through the part of the heat dissipator 13 joined to the base portion 11a on the side where the wiring conductor 12 is placed, so that distortion of the base portion 11a around the edge of the through hole 11c in which the wiring conductor 12 is located can be suppressed. This allows a compact and high-performance wiring substrate 1 to be achieved.

Moreover, as in the example shown in FIGS. 5A and 5B and in examples shown in FIGS. 8A, 8B, 11A, 11B, 14A, 14B, 17A, 17B, 18A, 18B, 20A, and 20B as will hereafter be referred to, in the transparent plan view, the outer edge of the lower-surface side of the part of the heat dissipator 13 joined to the base portion 11a on the side where the wiring conductor 12 is placed is located outside the opening of the frame portion 11b, that is; the outer edge is located at the edge of the through hole 11c so as to overlap the entire wiring conductors 12 exposed on the upper surface of the base portion 11a. In this case, heat is transmitted greatly through the part of the heat dissipator 13 joined to the base portion 11a on the side where the wiring conductor 12 is placed, so that distortion of the base portion 11a around the edge of the through hole 11c in which the wiring conductor 12 is located can be suppressed. This allows a compact and high-performance wiring substrate 1 to be achieved.

Otherwise, the method of manufacturing the wiring substrate 1 according to the second embodiment is similar to the method of manufacturing the wiring substrate 1 according to the preceding embodiment.

Third Embodiment

The following describes a wiring substrate 1 according to a third embodiment with reference to FIGS. 8A to 10C.

The wiring substrate 1 according to the third embodiment differs from the wiring substrates 1 according to the preceding embodiments in that, in the transparent plan view, the clearance W (W1, W2, W3, W4) between the inner surface of the through hole 11c and the side surface of the heat dissipator 13 includes different portions in side surfaces adjacent to each other of the heat dissipator 13.

Figure 8A:
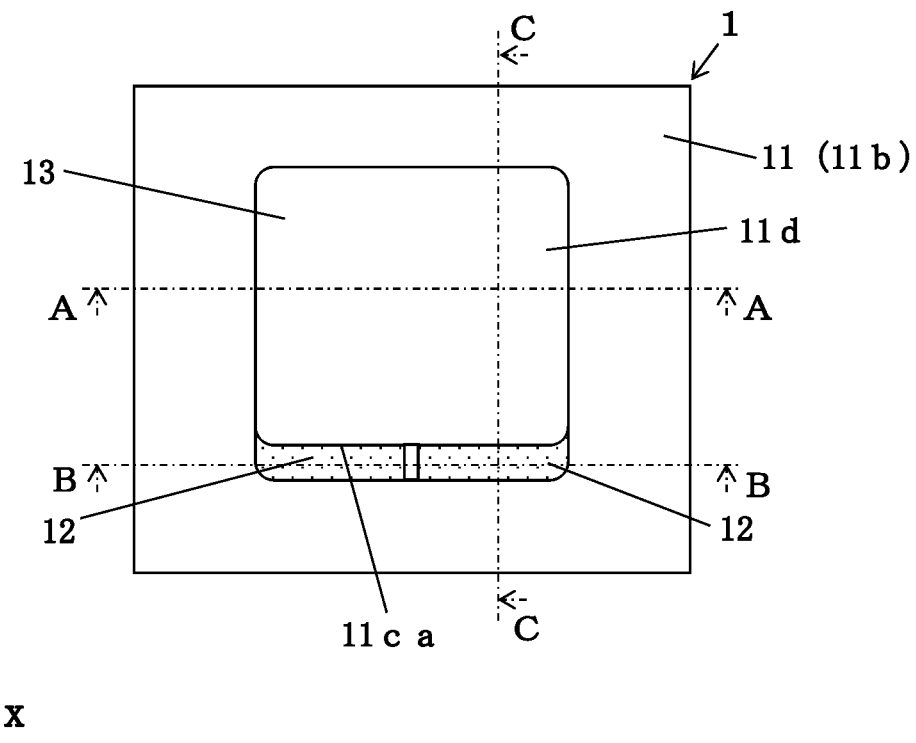
FIG. 8A is a top plan view showing a wiring substrate according to a third embodiment.
Figure 8B:
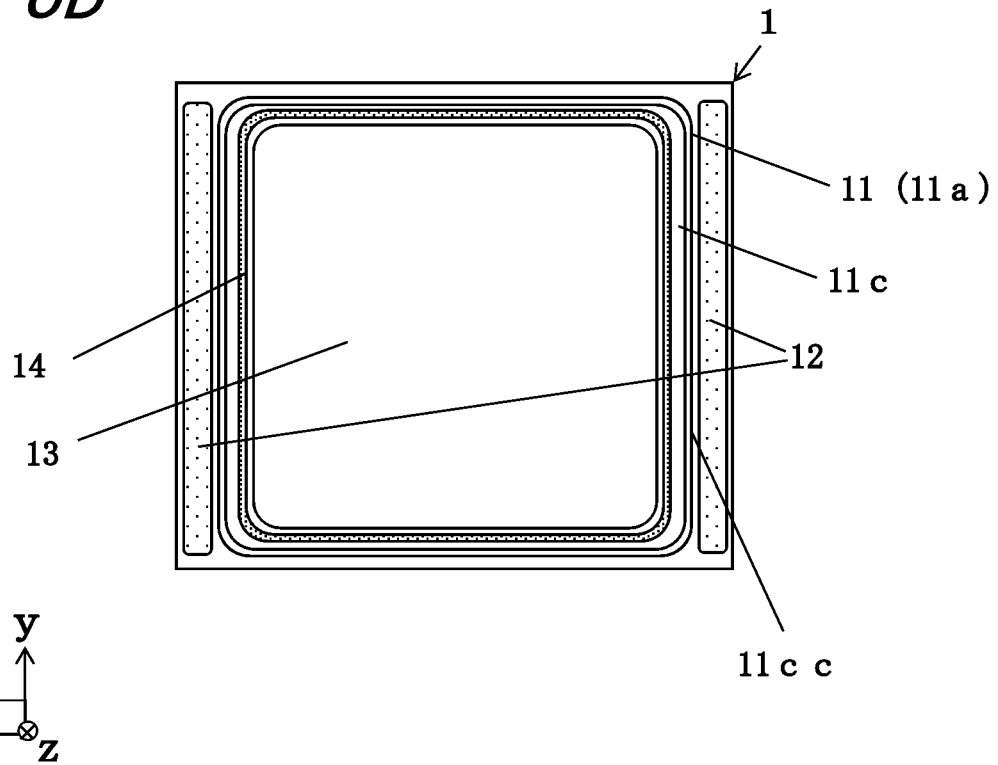
FIG. 8B is a bottom plan view of the wiring substrate shown in FIG. 8A.
Figure 9A:
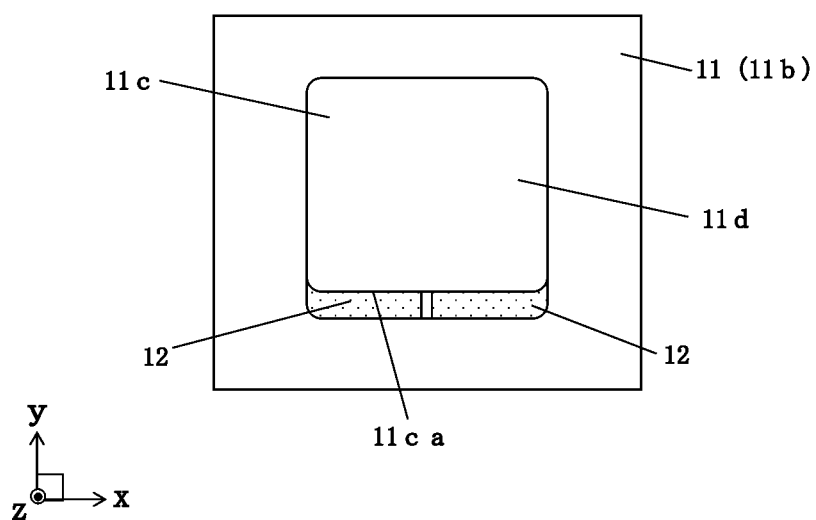
FIG. 9A is a top plan view showing an insulating substrate of the wiring substrate shown in FIGS. 8A and 8B.
Figure 9B:
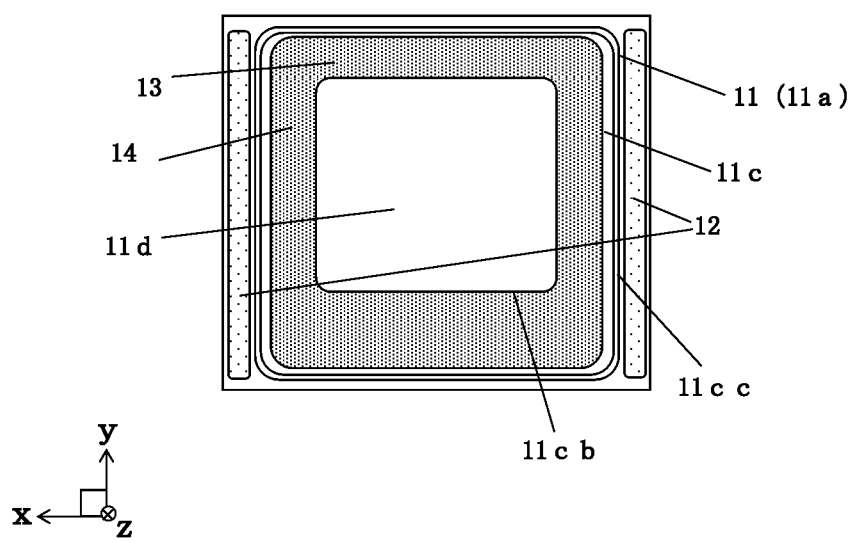
FIG. 9B is a bottom plan view of the insulating substrate shown in FIG. 9A.

In the example shown in FIGS. 8A to 9B, the wiring conductor 12 is indicated by a shaded area. In the example shown in FIGS. 8B and 9B, the connection conductor 14 is indicated by a shaded area. FIGS. 9A and 9B show top and bottom plan views of the insulating substrate 11 of the wiring substrate 1, with the heat dissipator 13 removed.

In the wiring substrate 1 according to the third embodiment, as in the example shown in FIGS. 8A, 8B and 10A to 10C, the heat dissipator 13-facing inner surface of the through hole 11c is inclined so that the diameter of the through hole 11c increases gradually with increasing distance from the frame portion 11b. Moreover, the side surface of the heat dissipator 13 facing the inner surface of the through hole 11c is stepped to provide a second shoulder, whereby the width of the heat dissipator 13 decreases with distance from the frame portion 11b.

Figure 10A:
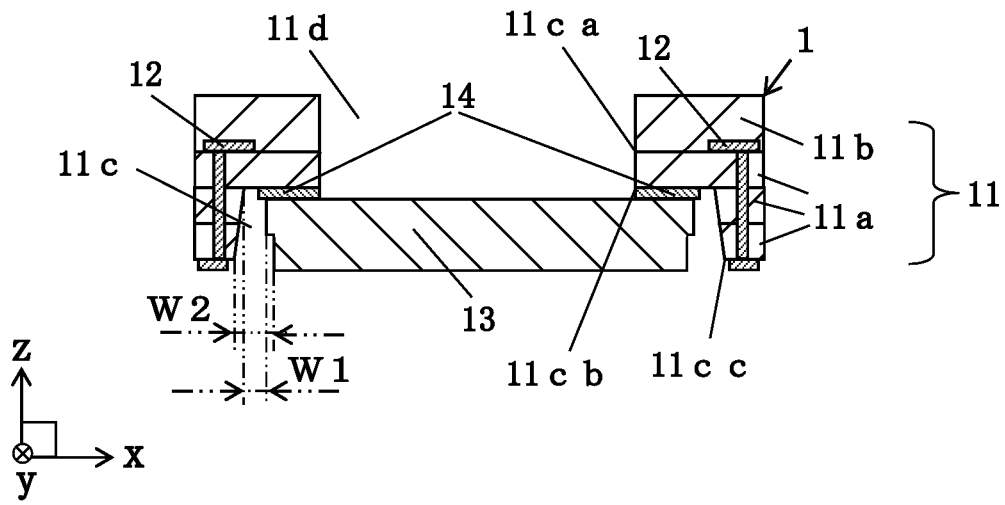
FIG. 10A is a sectional view of the wiring substrate taken along the line A-A shown in FIG. 8A.
Figure 10B:
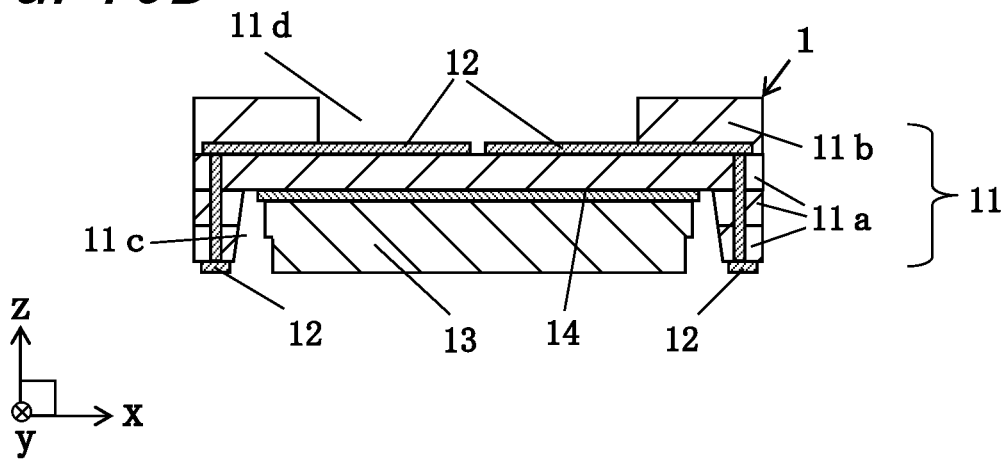
FIG. 10B is a sectional view of the wiring substrate taken along the line B-B shown in FIG. 8A.
Figure 10C:
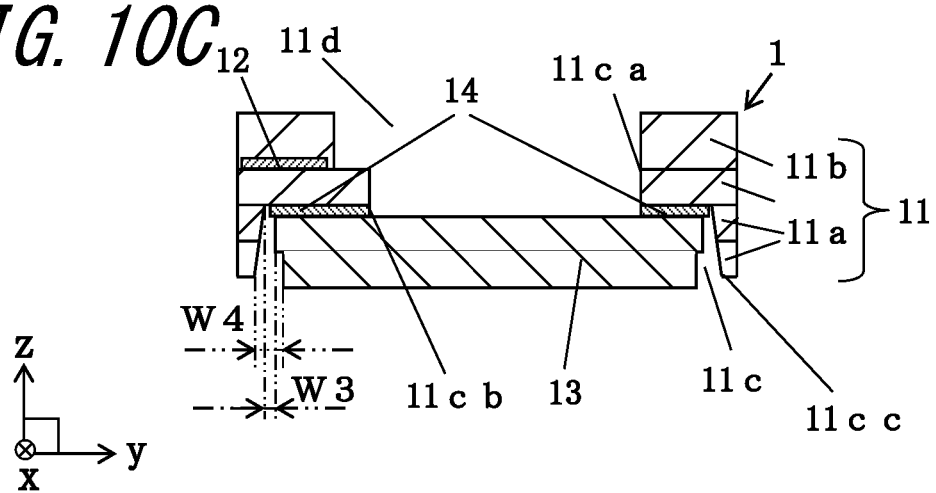
FIG. 10C is a sectional view of the wiring substrate taken along the line C-C shown in FIG. 8A.
Figure 11A:
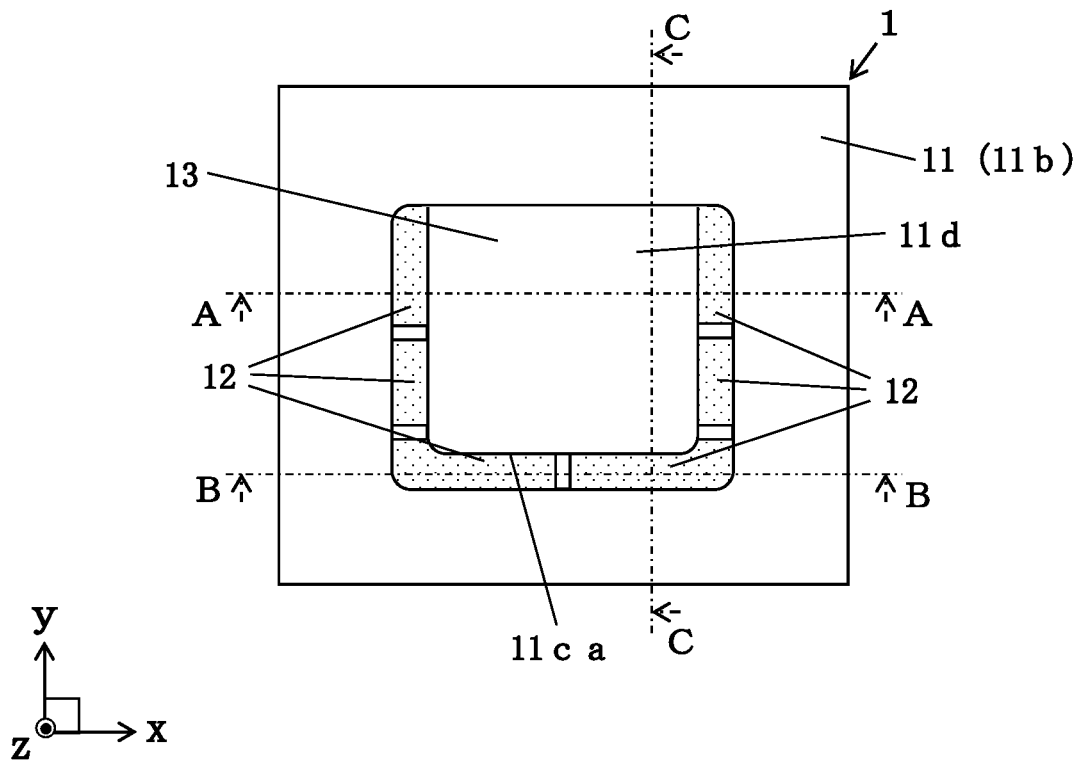
FIG. 11A is a top plan view showing another example of the wiring substrate according to the third embodiment.
Figure 11B:
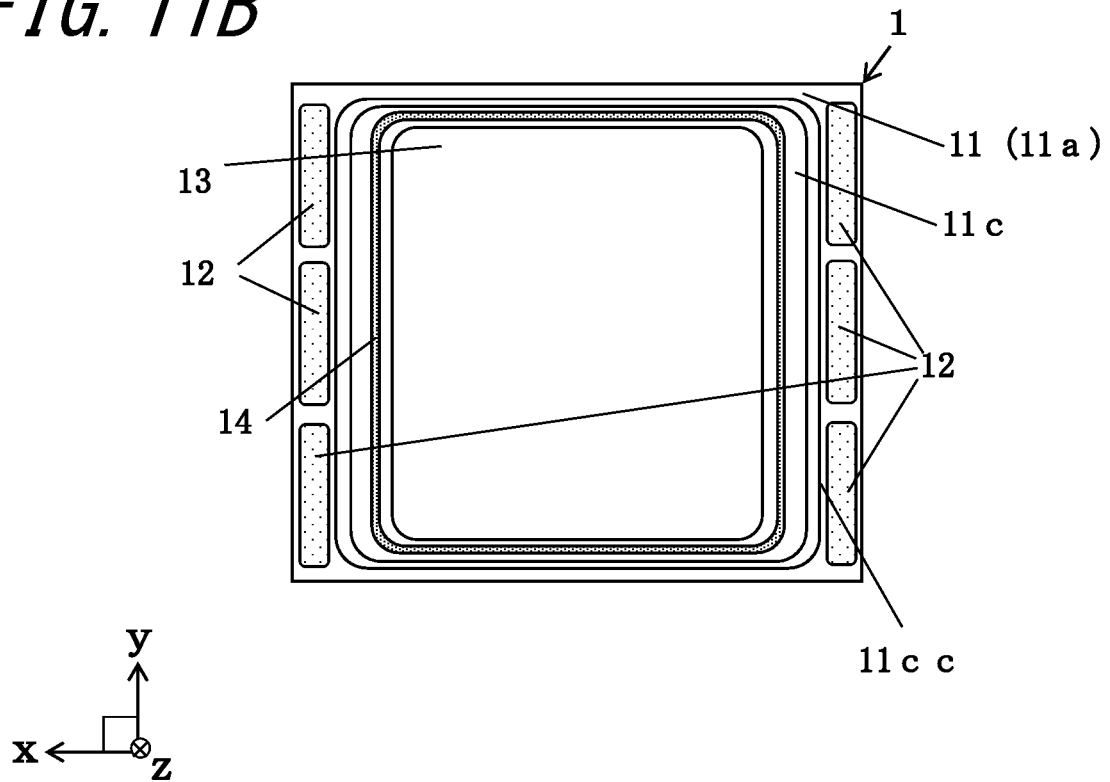
FIG. 11B is a bottom plan view of the wiring substrate shown in FIG. 11A.
Figure 12A:
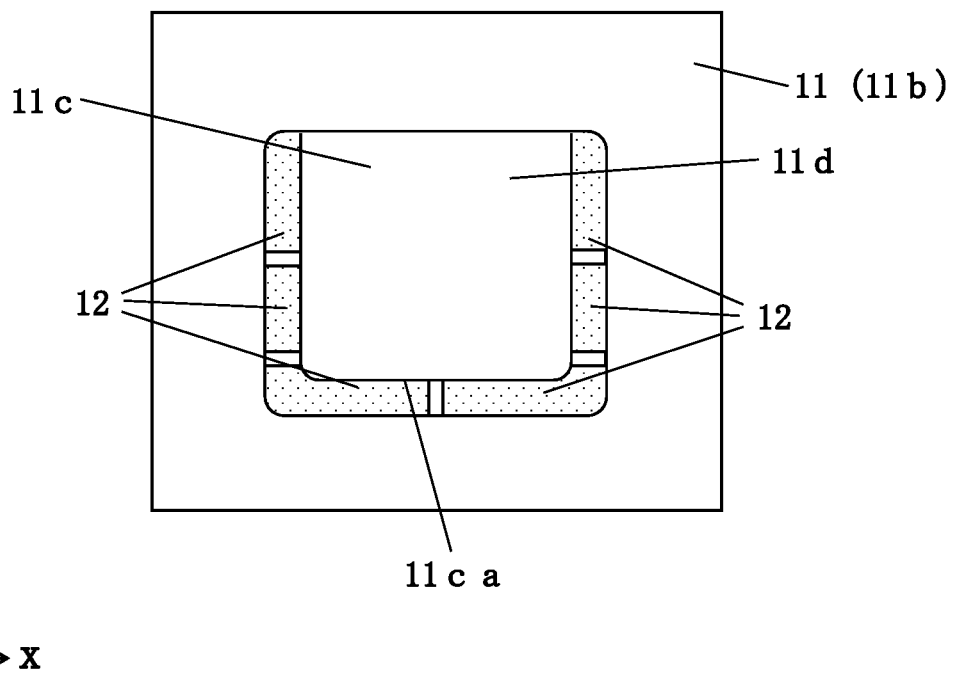
FIG. 12A is a top plan view showing an insulating substrate of the wiring substrate shown in FIGS. 11A and 11B.
Figure 12B:
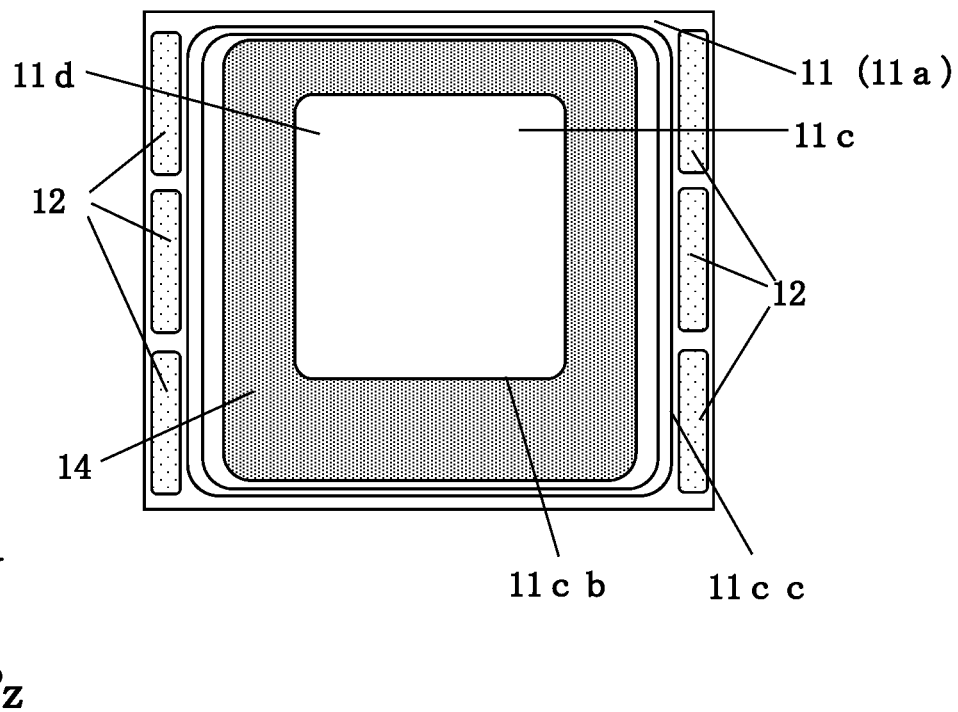
FIG. 12B is a bottom plan view of the insulating substrate shown in FIG. 12A.
Figure 13A:
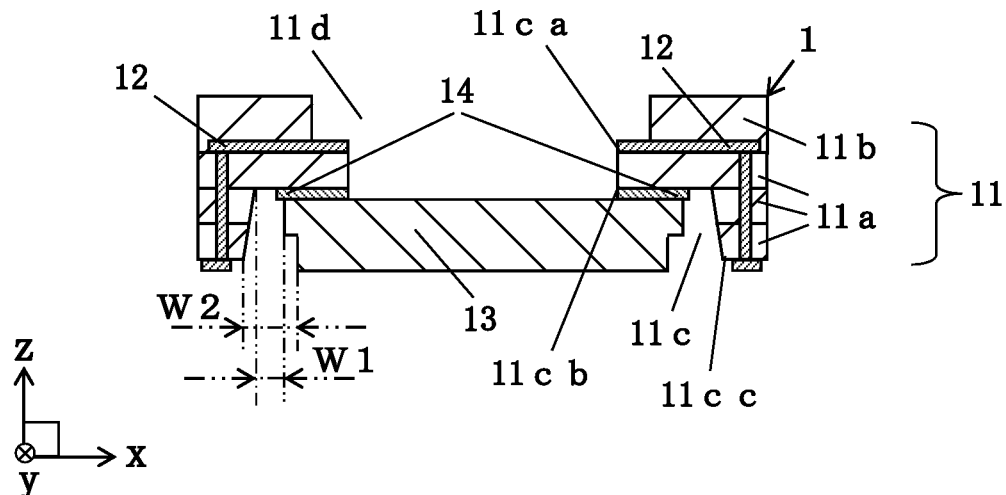
FIG. 13A is a sectional view of the wiring substrate taken along the line A-A shown in FIG. 11A.
Figure 13B:
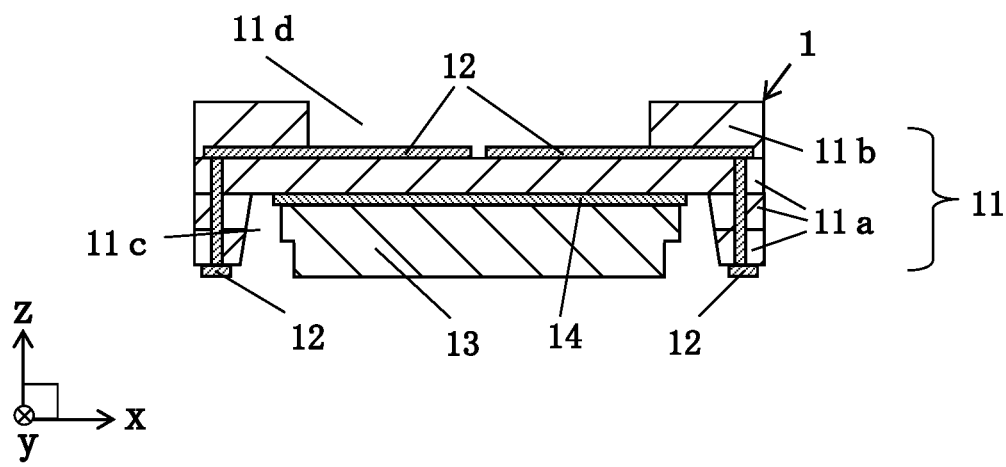
FIG. 13B is a sectional view of the wiring substrate taken along the line B-B shown in FIG. 11A.
Figure 13C:
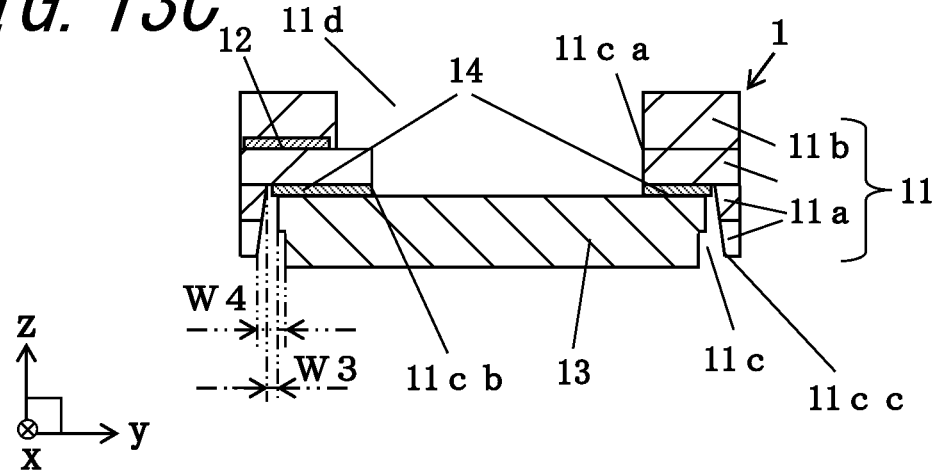
FIG. 13C is a sectional view of the wiring substrate taken along the line C-C shown in FIG. 11A.

In the wiring substrate 1 according to the third embodiment, as in the wiring substrate 1 according to the first embodiment and the wiring substrate 1 according to the second embodiment, for the positioning of the inner surface of the through hole 11c and the heat dissipator 13 with respect to each other, as in the example shown in FIGS. 10A to 10C, in the vertical sectional view, the clearance between the inner surface of the through hole 11c and the side surface of the heat dissipator 13 is wider in the vicinity of the third opening 11cc than in the vicinity of the frame portion 11b (W1<W2, W3<W4).

In the wiring substrate 1 according to the third embodiment, as in the wiring substrates 1 according to the preceding embodiments, the base portion 11a and the heat dissipator 13 can be joined together, the heat dissipator 13 can dissipate heat transmitted from the electronic element 2 mounted on the mounting face of the heat dissipator 13 properly through the lower surface and side surfaces, and the electronic element 2 mounted on the mounting face of the heat dissipator 13 can operate satisfactorily for long periods of time.

Moreover, in the case where the electronic element 2 is a light-emitting element, the wiring substrate may be built as a compact light-emitting device-specific wiring substrate capable of emitting light satisfactorily for long periods of time.

Moreover, the formation of the second shoulder in the heat dissipator 13 makes it possible to reduce the concentration of a stress on the juncture of the shoulder of the base portion 11a and the heat dissipator 13 during long-duration operation of the electronic element 2, and thereby minimize the chance that the base portion 11a and the heat dissipator 13 may become detached from each other.

Moreover, in the plan view, the clearance W (W1, W2, W3, W4) between the inner surface of the through hole 11c and the side surface of the heat dissipator 13 includes different portions in adjacent side surface of the heat dissipator 13 (W1≠W3, W2≠W4). In this case, in a region subjected to high amounts of heat, heat is dissipated properly through the lower surface and side surfaces of the heat dissipator 13. This makes it possible to reduce the occurrence of distortion in the junction between the base portion 11a (the connection conductor 14) and the heat dissipator 13, thereby suppress the detachment of the base portion 11a and the heat dissipator 13 from each other, and cause the electronic element 2 to operate satisfactorily for long periods of time. As in the example shown in FIGS. 8A, 8B and 10A to 10C, the clearance between the inner surface of the through hole 11c and the side surface of the heat dissipator 13 corresponding to the short side of the wiring substrate 1 (W1, W2) is wider than the clearance between the inner surface of the through hole 11c and the side surface of the heat dissipator 13 corresponding to the long side of the wiring substrate 1 (W3, W4) (W1>W3, W2>W4).

Moreover, as in the example shown in FIGS. 8A, 8B and 10A to 10C, the wiring conductor 12 is provided around the third opening 11cc, and in the plan view, the clearance between the inner surface of the through hole 11c and the side surface of the heat dissipator 13 in an area where the wiring conductor 12 is disposed around the third opening 11cc (right and left areas, respectively, of the through hole 11c as viewed in FIGS. 8A and 8B) (W1, W2) is wider than the clearance between the inner surface of the through hole 11c and the side surface of the heat dissipator 13 in the another area where no wiring conductor 12 is disposed around the third opening 11cc (top and bottom areas, respectively, of the through hole 11c as viewed in FIGS. 8A and 8B) (W3, W4) (W1>W3, W2>W4). In this case, under the application of high electric current, it is possible to reduce the occurrence of distortion in the junction between the base portion 11a (the connection conductor 14) and the heat dissipator 13, thereby suppress the detachment of the base portion 11a and the heat dissipator 13 from each other, and cause the electronic element 2 to operate satisfactorily for long periods of time.

As in the example shown in FIGS. 8A, 8B and 10A to 10C, in the plan view, the clearance between the inner surface of the through hole 11c and the outer edge of the connection conductor 14 in the area where the wiring conductor 12 is disposed around the third opening 11cc differs from the clearance between the inner surface of the through hole 11c and the outer edge of the connection conductor 14 in the another area where no wiring conductor 12 is disposed around the third opening 11cc. This causes variation in the clearance W (clearance between the inner surface of the through hole 11c and the side surface of the heat dissipator 13) between the adjacent side surfaces of the heat dissipator 13 (W1≠W3, W2≠W4). In the above-described case, in the plan view, the clearance between the inner surface of the through hole 11c and the outer edge of the connection conductor 14 in the area where the wiring conductor 12 is disposed around the third opening 11cc is wider than the clearance between the inner surface of the through hole 11c and the outer edge of the connection conductor 14 in the another area where no wiring conductor 12 is disposed around the third opening 11cc.

Moreover, as in the example shown in FIGS. 11A to 13C, variation in the clearance W (clearance between the inner surface of the through hole 11c and the side surface of the heat dissipator 13) between the adjacent side surfaces of the heat dissipator 13 may be caused by varying the inclination of the inner surface of the through hole 11c. That is, the inner surface of the through hole 11c corresponding to an area where the wiring conductor 12 is disposed around the third opening 11cc (right and left areas, respectively, of the through hole 11c as viewed in FIGS. 11A and 11B) is inclined more greatly than the inner surface of the through hole 11c corresponding to the another area where no wiring conductor 12 is disposed around the third opening 11cc (top and bottom areas, respectively, of the through hole 11c as viewed in FIGS. 11A and 11B). The above-described design makes it possible to widen the opening of the base portion 11a in the area subjected to high amounts of heat, and thereby dissipate heat transmitted from the electronic element 2 mounted on the mounting face of the heat dissipator 13 properly through the lower surface the side surfaces of the heat dissipator 13, and cause the electronic element 2 mounted on the mounting face of the heat dissipator 13 to operate satisfactorily for long periods of time.

Variation in the clearance W (clearance between the inner surface of the through hole 11c and the side surface of the heat dissipator 13) between the adjacent side surfaces of the heat dissipator 13 may also be caused by varying the width of the second shoulder of the heat dissipator 13. That is, as in the example shown in FIGS. 11A to 13C, the second shoulder corresponding to an area where the wiring conductor 12 is disposed around the third opening 11cc (the right and left areas, respectively, of the through hole 11c as viewed in FIGS. 11A and 11B) is made wider than the second shoulder corresponding to the another area where no wiring conductor 12 is disposed around the third opening 11cc (the top and bottom areas, respectively, of the through hole 11c as viewed in FIGS. 11A and 11B). The above-described design is suitably used for cases where, for example, the electronic element 2-mounting portion needs to be made in smaller size, and such use permits size and weight reduction in the wiring substrate 1 and in the electronic device as well accordingly.

Otherwise, the method of manufacturing the wiring substrate 1 according to the third embodiment is similar to the methods of manufacturing the wiring substrate 1 according to the preceding embodiments.

Fourth Embodiment

The following describes a wiring substrate 1 according to a fourth embodiment with reference to FIGS. 14A to 17B, and also FIGS. 5A to 13C that have already been referred to.

The wiring substrate 1 according to the fourth embodiment differs from the wiring substrates 1 according to the preceding embodiments in that, the base portion 11a, includes a plurality of wiring conductors 12 thereon, the plurality of wiring conductors 12 are located along the edge of the first opening 11ca as viewed in the plan view, and the plurality of wiring conductors 12 overlap the heat dissipator 13, as viewed in the transparent plan view.

Figure 14A:
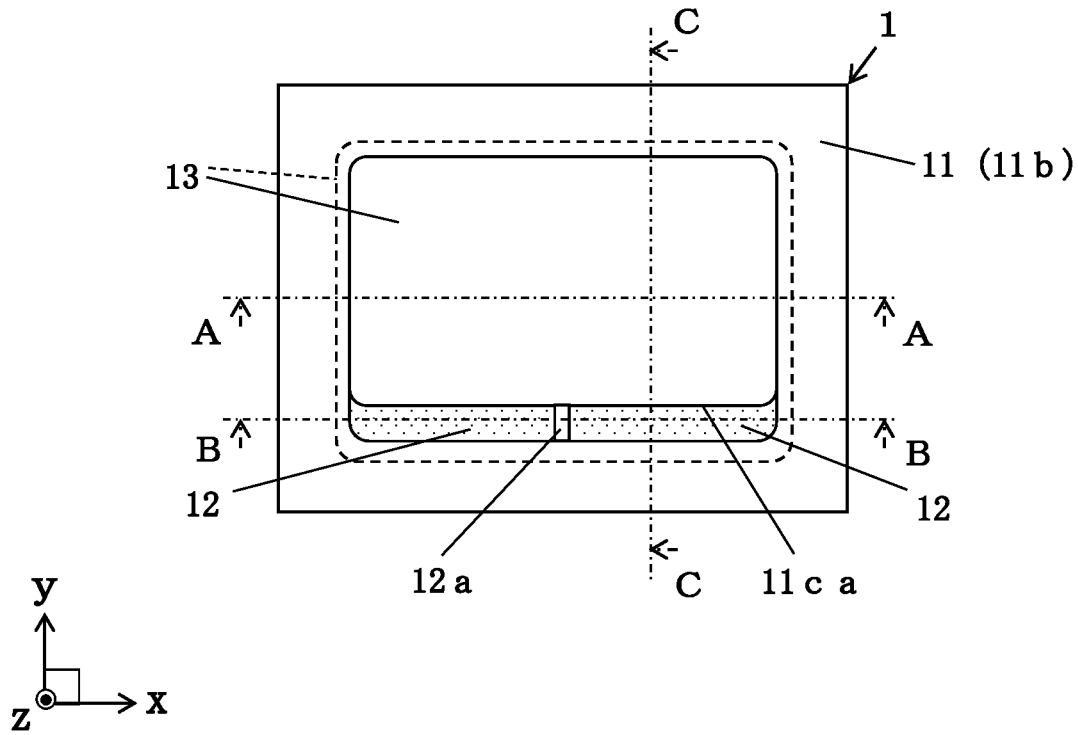
FIG. 14A is a top plan view showing a wiring substrate according to a fourth embodiment.
Figure 14B:
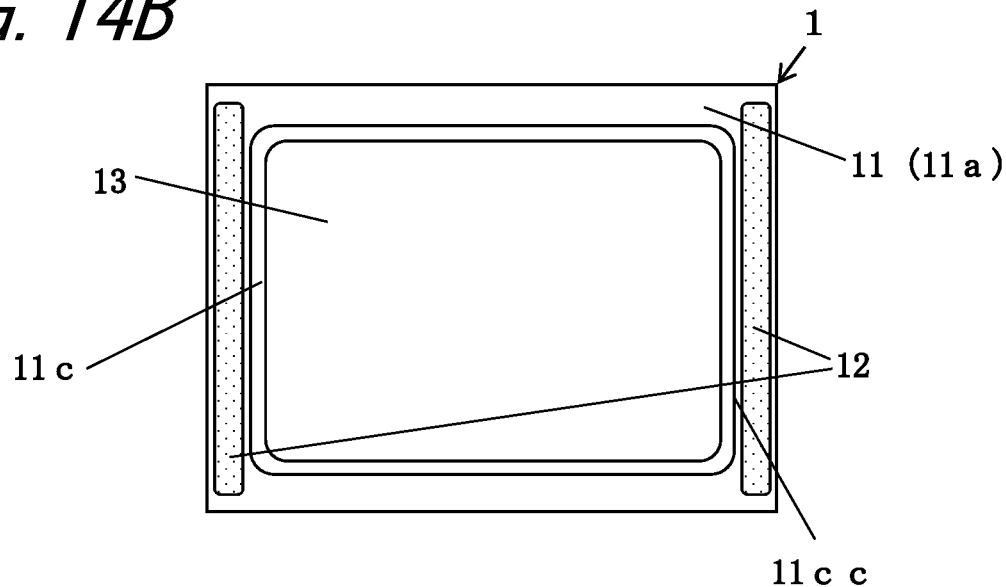
FIG. 14B is a bottom plan view of the wiring substrate shown in FIG. 14A.
Figure 15:
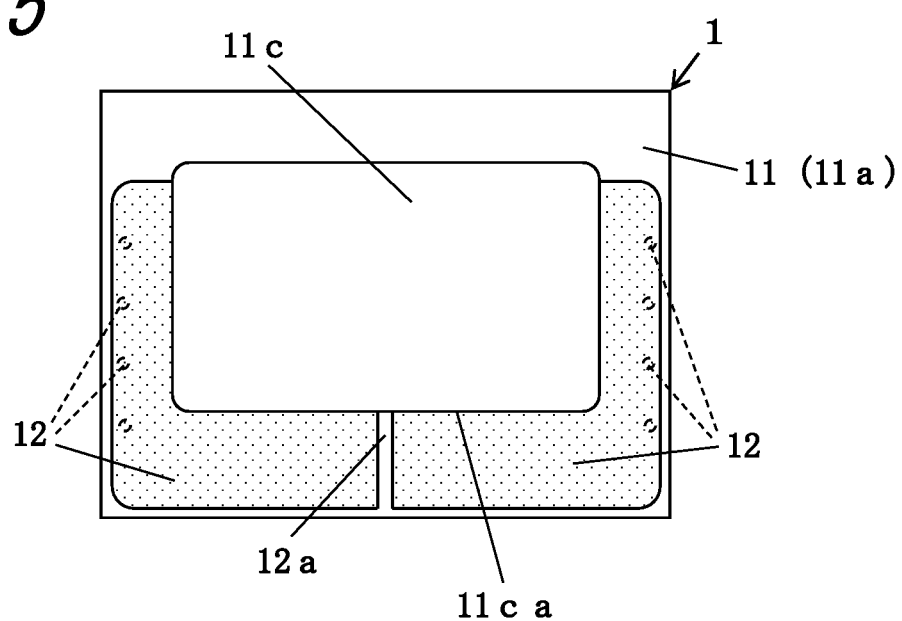
FIG. 15 is an internal top view showing a base portion of the wiring substrate shown in FIGS. 14A and 14B.
Figure 16A:
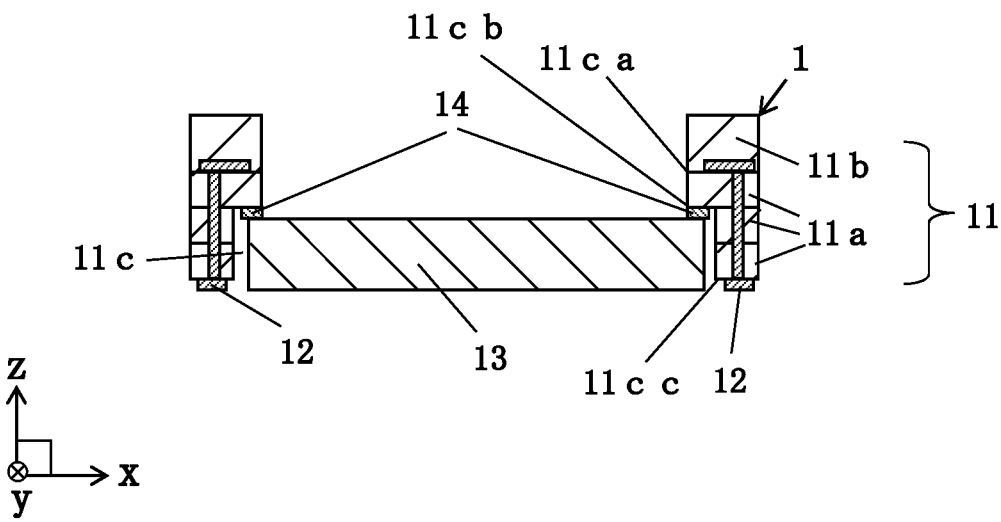
FIG. 16A is a sectional view of the wiring substrate taken along the line A-A shown in FIG. 14A.
Figure 16B:
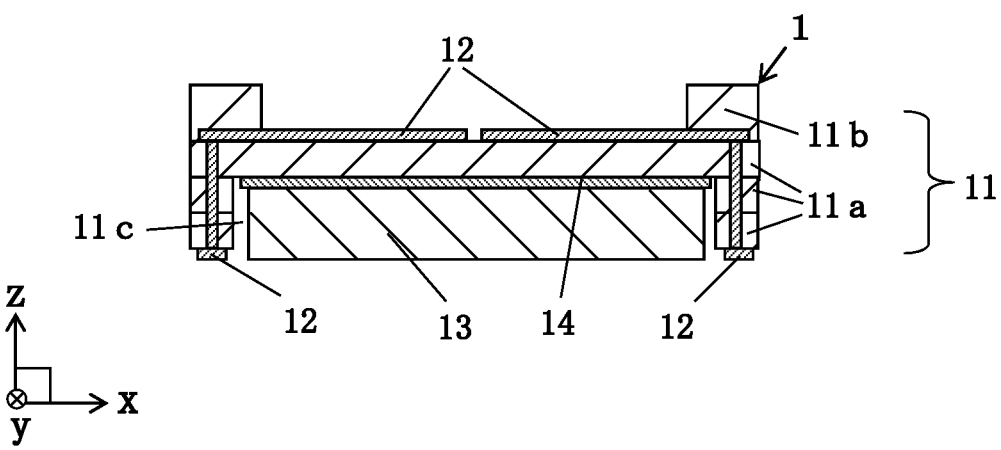
FIG. 16B is a view of a section along the line B-B of FIG. 14A.
Figure 16C:
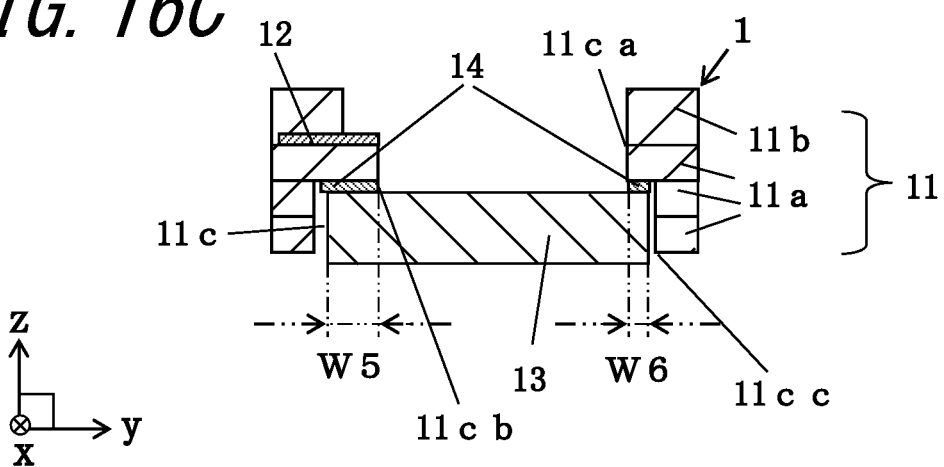
FIG. 16C is a view of a section along the line C-C of FIG. 14A.
Figure 17A:
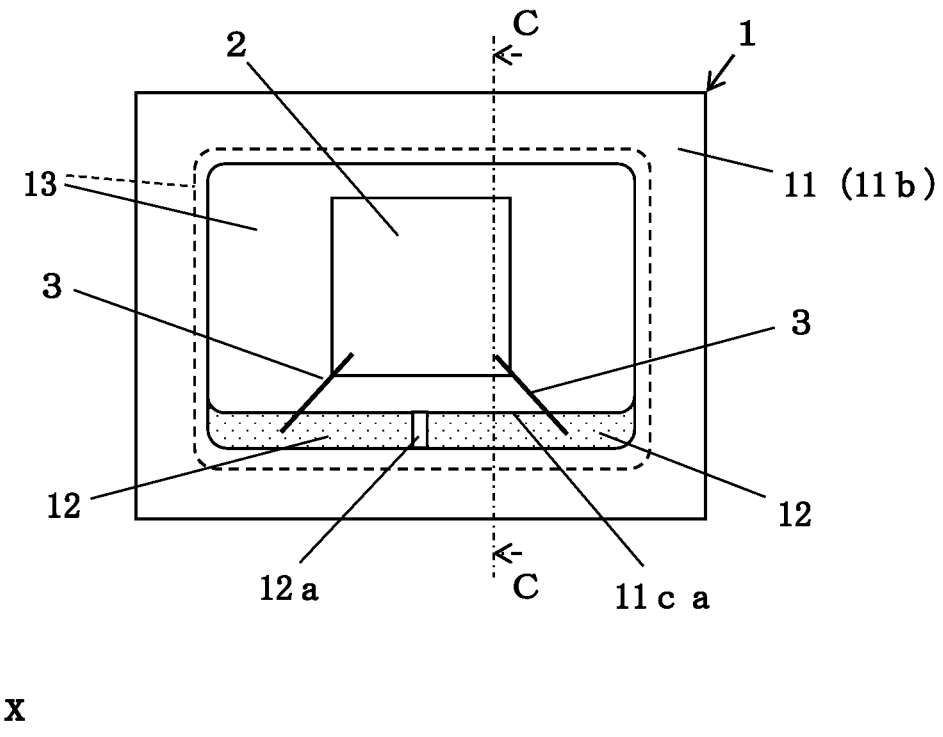
FIG. 17A is a top plan view of an electronic device in which an electronic element is mounted on the wiring substrate shown in FIGS. 14A and 14B.
Figure 17B:
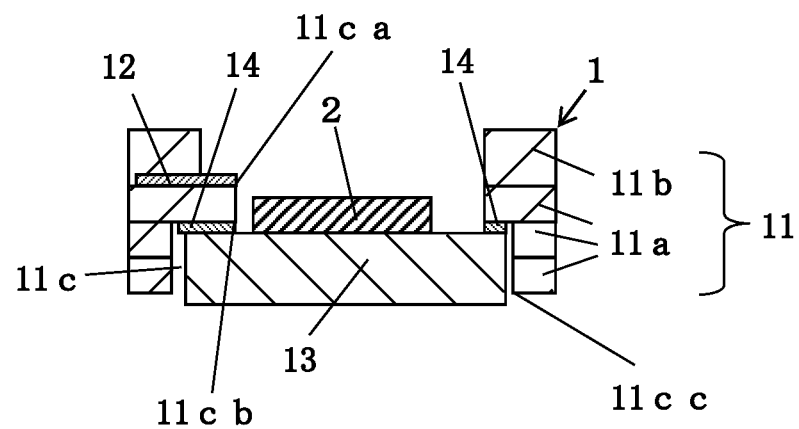
FIG. 17B is a sectional view taken along the line C-C of FIG. 17A.

In the example shown in FIGS. 14A and 14B, as well as FIGS. 15 and 17A, the plurality of wiring conductors 12 are each indicated by a shaded area. In the example shown in FIG. 15, a part of overlap of the periphery of the through conductor of each of a plurality of the wiring conductors 12 and the corresponding wiring layer of the wiring conductor 12 is indicated by a dotted line. In the example shown in FIGS. 14A, 17A and 17B, in the transparent plan view, a part of overlap of the outer edge of the heat dissipator 13 and the frame portion 11b (insulating substrate 11) is indicated by a dotted line.

In the wiring substrate 1 according to the fourth embodiment, as in the wiring substrates 1 according to the preceding embodiments, the base portion 11a and the heat dissipator 13 can be joined together, the heat dissipator 13 can dissipate heat transmitted from the electronic element 2 mounted on the mounting face of the heat dissipator 13 properly through the lower surface and side surfaces of the heat dissipator 13, and the electronic element 2 mounted on the mounting face of the heat dissipator 13 can operate satisfactorily for long periods of time.

In the wiring substrate 1 according to the fourth embodiment, the base portion 11a includes the plurality of wiring conductors 12 thereon, the plurality of wiring conductors 12 are located along the edge of the first opening 11ca as viewed in the plan view, and the plurality of wiring conductors 12 overlap the heat dissipator 13 as viewed in the transparent plan view. In this case, even if a local increase in heat liberation from a plurality of the wiring conductors 12 occurs due to the offset or lopsided arrangement of the plurality of the wiring conductors 12 on the base portion 11a, heat can be transmitted efficiently to the heat dissipator 13 which overlap the plurality of wiring conductors, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2.

Moreover, as in the example shown in FIGS. 14A to 17B, in the transparent plan view, the plurality of wiring conductors 12 located on the base portion 11a are biasedly located on one edge side of the first opening 11ca. In this case, as compared to a case where the wiring conductors 12 are located on each edge side of the through hole 11c, the wiring substrate 1 can be made more compact.

As in the example shown in FIGS. 14A to 17B, the plurality of wiring conductors 12 are biasedly located on one edge side of the first opening 11ca, and, in the transparent plan view, a width W5 of a part of the heat dissipator 13 joined to the base portion 11a on the side where the plurality of wiring conductors 12 are placed is greater than a width W6 of a part of the heat dissipator 13 joined to the base portion 11a on the opposite side in a thickness direction thereof (W5>W6). In this case, even if a local increase in heat liberation from the plurality of wiring conductors 12 occurs due to the offset or lopsided arrangement of the plurality of wiring conductors 12 on the base portion 11a, heat is transmitted greatly through the part of the heat dissipator 13 joined to the base portion 11a on the side where the plurality of wiring conductors 12 are placed, so that distortion of the base portion 11a around the edge of the first opening 11ca in which the plurality of wiring conductors 12 are located can be suppressed. This allows a compact and high-performance wiring substrate 1 to be achieved.

In the transparent plan view, at the one edge of the first opening 11ca, the outer edge of the heat dissipator 13 is located outside the opening of the frame portion 11b, that is; the outer edge is located on the edge of the first opening 11ca so as to overlap the whole of the plurality of wiring conductors 12 exposed on the upper surface of the base portion 11a. In this case, heat is transmitted greatly through the part of the heat dissipator 13 joined to the base portion 11a on the side where the plurality of wiring conductors 12 are placed, so that distortion of the base portion 11a around the edge of the first opening 11ca in which the plurality of wiring conductors 12 are located can be suppressed. This allows a compact and high-performance wiring substrate 1 to be achieved.

As in the example shown in FIGS. 14A to 17B, the first opening 11ca is quadrangular in plan configuration. In this case, in the transparent plan view, the plurality of wiring conductors 12 and the heat dissipator 13 linearly overlap each other, and thus heat is transmitted efficiently to the heat dissipator 13 which overlaps the plurality of wiring conductors in the transparent plan view, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2. The through hole 11c may be made in a quadrangular form including arcuately rounded corners, as viewed in the plan view.

There is provided a slit portion 12a, which is defined by a space between the edges of neighboring wiring conductors of the plurality of wiring conductors 12. In this case, in the plan view, heat from the plurality of wiring conductors 12 is distributed with respect to the slit portion 12a as a boundary. Thus, even if a local increase in heat liberation from a plurality of the wiring conductors 12 occurs due to the offset or lopsided arrangement of the plurality of wiring conductors 12 on the base portion 11a, heat is transmitted efficiently to the heat dissipator 13 which overlaps the plurality of wiring conductors in the transparent plan view, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2.

Moreover, as in the example shown in FIG. 15, the plurality of wiring conductors 12 placed in the insulating substrate 11 are each provided with a plurality of through conductors that are spaced apart along an edge of the first opening 1ca that is contiguous to the one edge of the first opening 11ca in which a plurality of the wiring conductors 12 are located. In this case, heat from the plurality of through conductors of the wiring conductor 12 is clear of the plurality of wiring conductors 12 overlapping the heat dissipator 13, as viewed in the plan view. Consequently, it is possible to obtain a compact and high-performance wiring substrate that enables the electronic element 2 to function satisfactorily during long-duration operation of the electronic element 2.

Moreover, as in the example shown in FIG. 15, in the plan view, the plurality of wiring conductors 12 are each located along a region which extends from one side of the first opening 11ca where the slit portion 12a is contiguous to another side of the fist opening 11ca that is contiguous to the one side, and the plurality of wiring conductors 12 overlap the heat dissipator 13. In this case, even if a local increase in heat liberation from the plurality of wiring conductors 12 occurs due to the offset or lopsided arrangement of the plurality of wiring conductors 12 on the base portion 11a, heat is transmitted efficiently to the heat dissipator 13 which overlaps the plurality of wiring conductors as viewed in the transparent plan view, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2.

Moreover, as in the example shown in FIGS. 14A to 17B and in the example shown in FIGS. 18A to 21C as will hereafter be referred to, the slit portion 12a is located at a position corresponding to the center of the one side of the first opening 11ca. This makes it possible to reduce the influence of the offset or lopsided arrangement of the plurality of wiring conductors 12 on the base portion 11a, and thereby achieve efficient heat dissipation to the heat dissipator 13 which overlaps the plurality of wiring conductors as viewed in the transparent plan view, so that distortion of the base portion 11a around the edge in which the plurality of wiring conductors 12 are located can be suppressed. Consequently, it is possible to obtain a compact and high-performance wiring substrate that enables the electronic element 2 to function satisfactorily during long-duration operation of the electronic element 2.

Moreover, as in the examples shown in FIGS. 5A to 13C that have already been referred to, the formation of a shoulder in the heat dissipator 13 makes it possible to reduce the concentration of a stress on the juncture of the shoulder of the base portion 11a and the heat dissipator 13 during long-duration operation of the electronic element 2, and thereby suppress the detachment of the base portion 11a and the heat dissipator 13 from each other. In this case, in the plan view, each side of the upper surface of the heat dissipator 13 is longer than the corresponding side of the lower surface of the heat dissipator 13. Alternatively, the heat dissipator 13 may be configured so that, in the plan view, each side of the lower surface of the heat dissipator 13 is longer than the corresponding side of the upper surface of the heat dissipator 13.

Otherwise, the method of manufacturing the wiring substrate 1 according to the fourth embodiment is similar to the methods of manufacturing the wiring substrates 1 according to the preceding embodiments.

Fifth Embodiment

The following describes a wiring substrate 1 according to a fifth embodiment with reference to FIGS. 18A to 19C.

The wiring substrate 1 according to the fifth embodiment differs from the wiring substrates 1 according to the preceding embodiments in that, in the transparent plan view, the plurality of wiring conductors 12 are located on edge sides of two adjacent sides of the first opening 11ca, and also, in the transparent plan view, the plurality of wiring conductors 12 each overlap the heat dissipator 13 on corresponding one of the edge sides of two adjacent sides of the first opening 11ca.

Figure 18A:
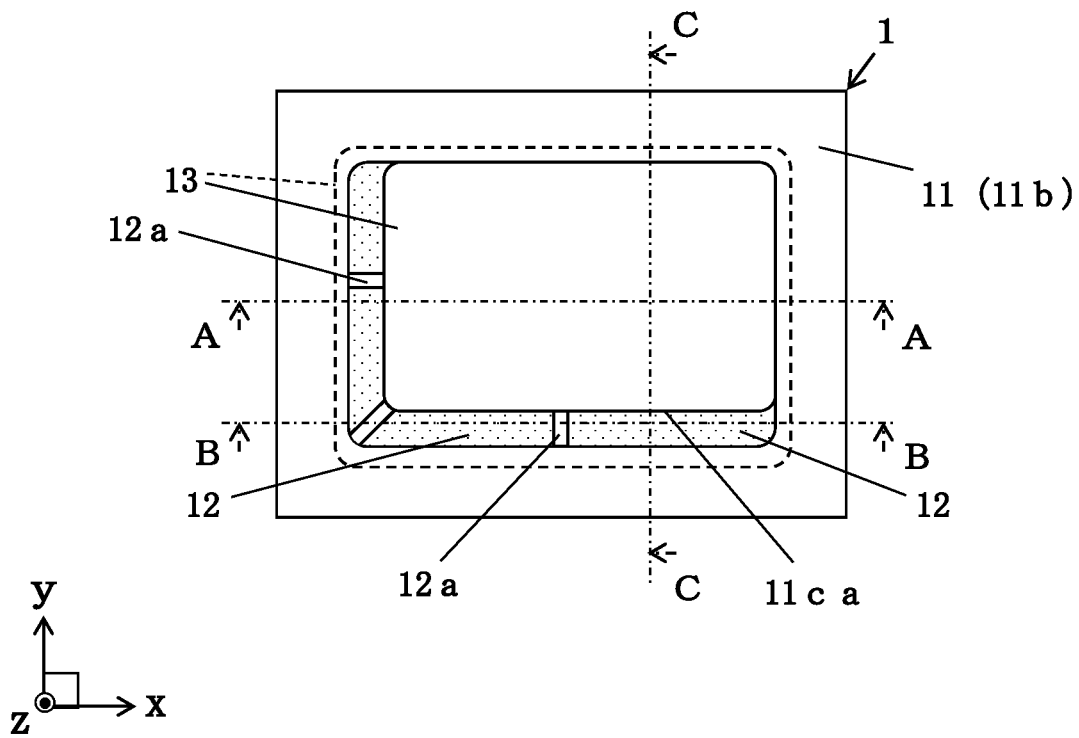
FIG. 18A is a top plan view showing a wiring substrate according to a fifth embodiment.
Figure 18B:
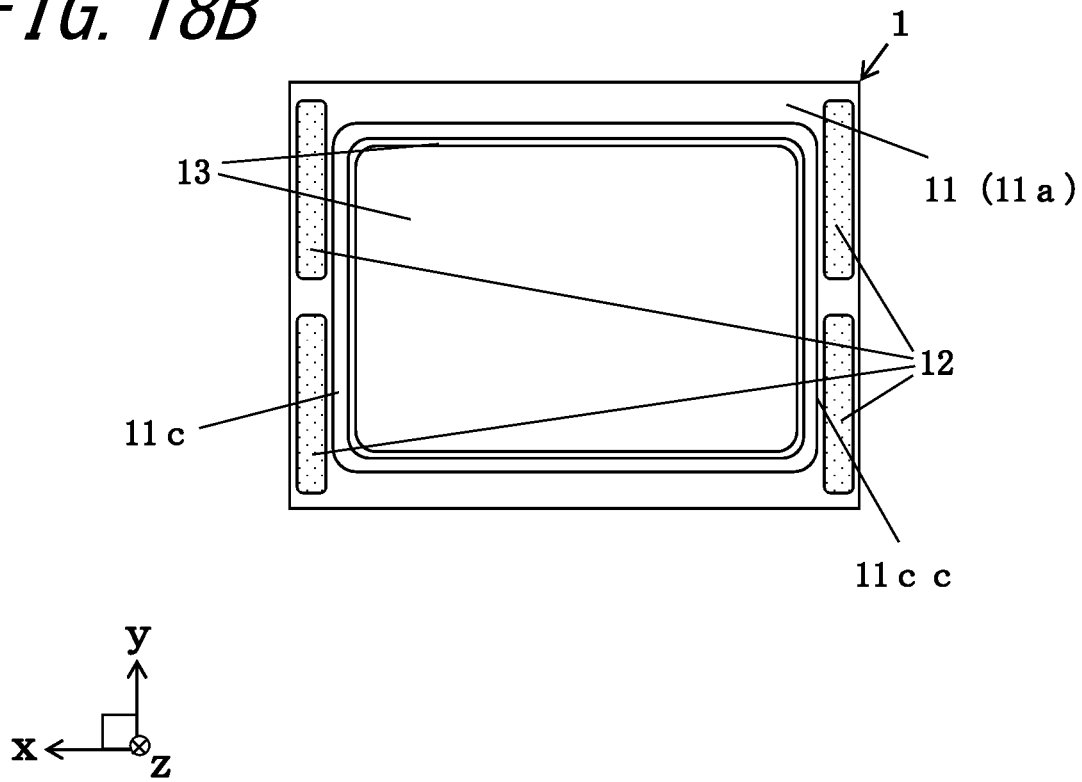
FIG. 18B is a bottom plan view of the wiring substrate shown in FIG. 18A.
Figure 19A:
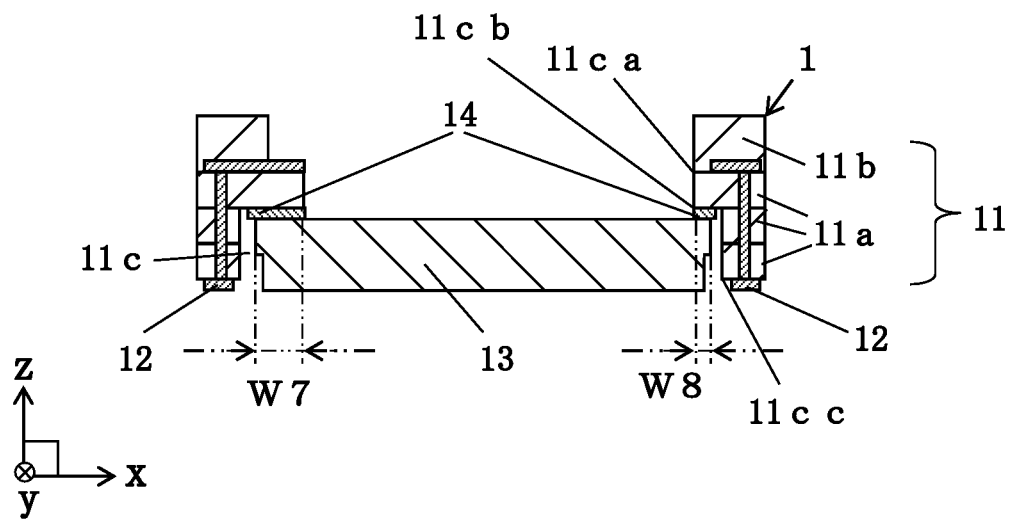
FIG. 19A is a sectional view of the wiring substrate taken along the line A-A shown in FIG. 18A.
Figure 19B:
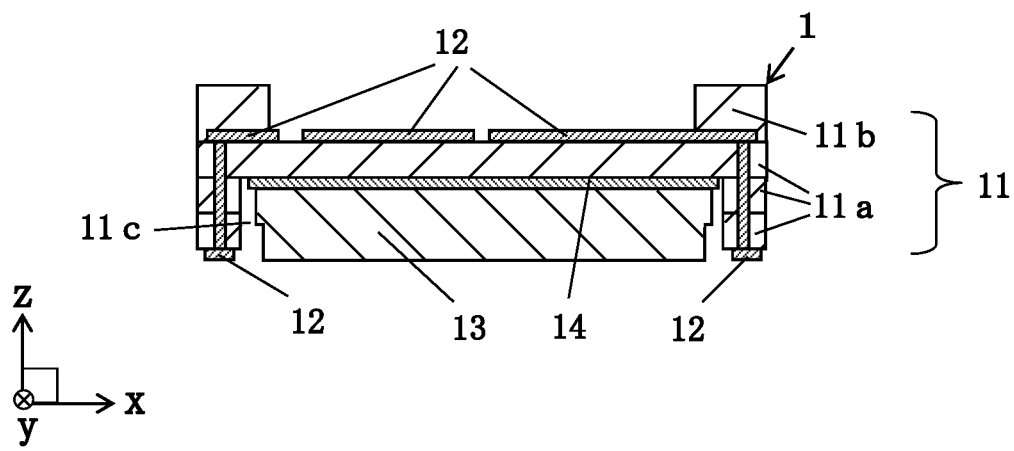
FIG. 19B is a view of a section along the line B-B of FIG. 18A.
Figure 19C:
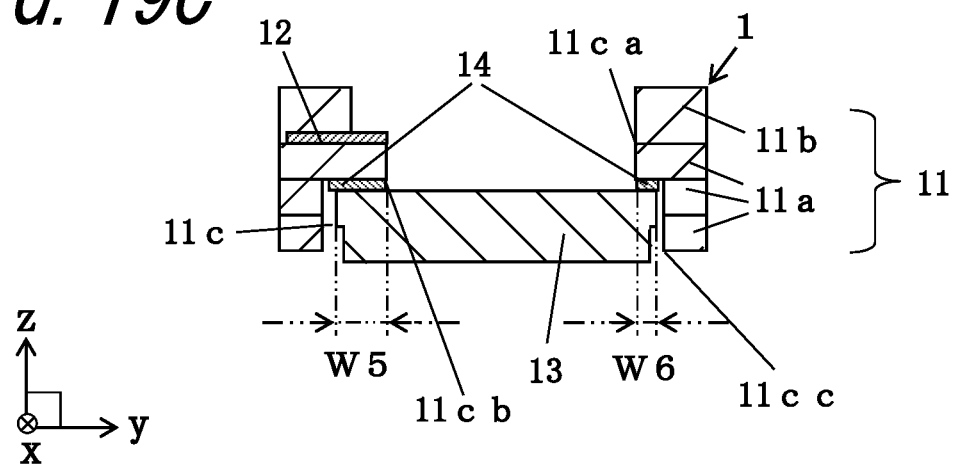
FIG. 19C is a view of a section along the line C-C of FIG. 18A.

In the example shown in FIGS. 18A and 18B, the plurality of wiring conductors 12 are each indicated by a shaded area. In the example shown in FIG. 18A, in the transparent plan view, a part of overlap of the outer edge of the heat dissipator 13 and the frame portion 11b is indicated by a dotted line.

In the wiring substrate 1 according to the fifth embodiment, as in the wiring substrates 1 according to the preceding embodiments, the base portion 11a and the heat dissipator 13 can be joined together, the heat dissipator 13 can dissipate heat transmitted from the electronic element 2 mounted on the mounting face of the heat dissipator 13 properly through the lower surface and side surfaces of the heat dissipator 13, and the electronic element 2 mounted on the mounting face of the heat dissipator 13 can operate satisfactorily for long periods of time.

As in the example shown in FIGS. 18A and 18B, the slit portion 12a is located at a position corresponding to the center of the one side of the first opening 11ca, as well as at the corner of the through hole 11c. This permits distribution of heat from the plurality of wiring conductors 12 with respect to the slit portion 12a as a boundary. Thus, even if a local increase in heat liberation from the plurality of wiring conductors 12 occurs due to the offset or lopsided arrangement of the plurality of wiring conductors 12 on the base portion 11a, heat is transmitted efficiently to the heat dissipator 13 which overlaps the plurality of wiring conductors as viewed in the transparent plan view, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2.

Moreover, as in the example shown in FIGS. 18A to 19C, the plurality of wiring conductors 12 are biasedly located on two adjacent edge sides of the first opening 11ca, and also, in the transparent plan view, on each edge side, a width (W5, W7) of a part of the heat dissipator 13 joined to the base portion 11a on the side where the plurality of wiring conductors 12 are placed is greater than a width (W6, W8) of a part of the heat dissipator 13 joined to the base portion 11a on the opposite side in a thickness direction thereof (W5>W6, W7>W8). In this case, even if a local increase in heat liberation from the plurality of wiring conductors 12 occurs due to the offset or lopsided arrangement of the plurality of wiring conductors 12 on the base portion 11a, heat is transmitted greatly through the part of the heat dissipator 13 joined to the base portion 11a on the side where the plurality of wiring conductors 12 are placed, so that distortion of the base portion 11a around the edge of the first opening 11ca in which the plurality of wiring conductors 12 are located can be suppressed. This allows a compact and high-performance wiring substrate 1 to be achieved.

Otherwise, the method of manufacturing the wiring substrate 1 according to the fifth embodiment is similar to the methods of manufacturing the wiring substrates 1 according to the preceding embodiments.

Sixth Embodiment

The following describes a wiring substrate 1 according to a sixth embodiment with reference to FIGS. 20A to 21C, and also FIGS. 11A to 13C that have already been referred to.

The wiring substrate 1 according to the sixth embodiment differs from the wiring substrates 1 according to the preceding embodiments in that, in the plan view, a plurality of wiring conductors 12 are located on three edge sides of the first opening 11ca.

Figure 20A:
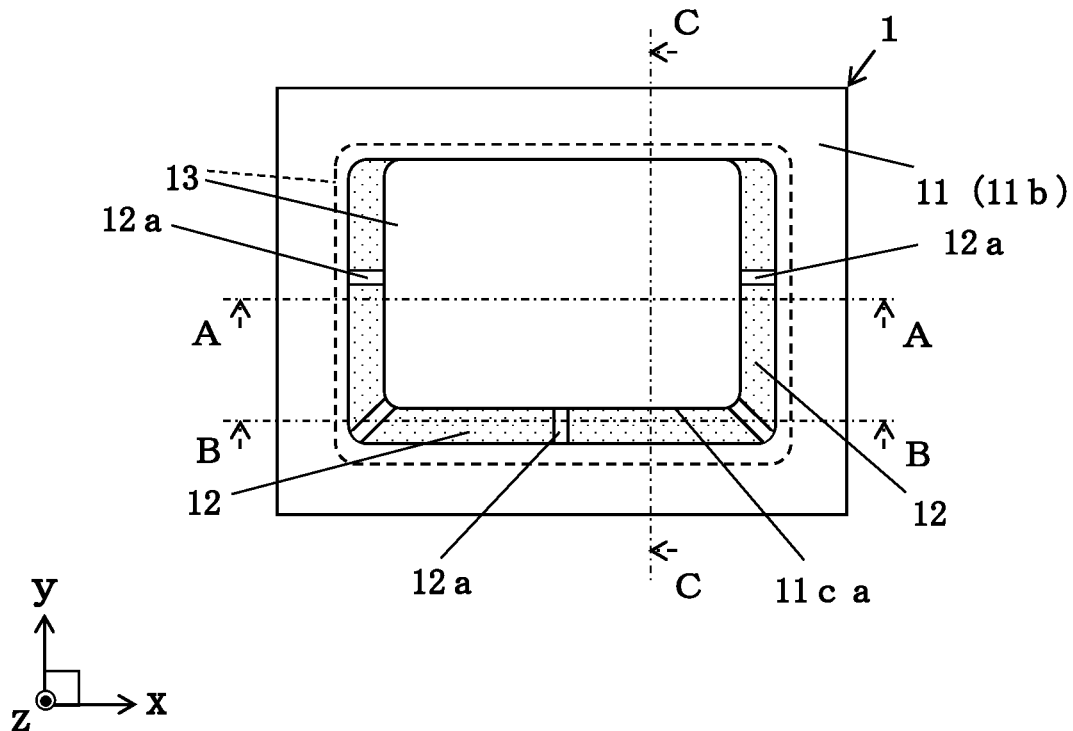
FIG. 20A is a top plan view showing a wiring substrate according to a sixth embodiment.
Figure 20B:
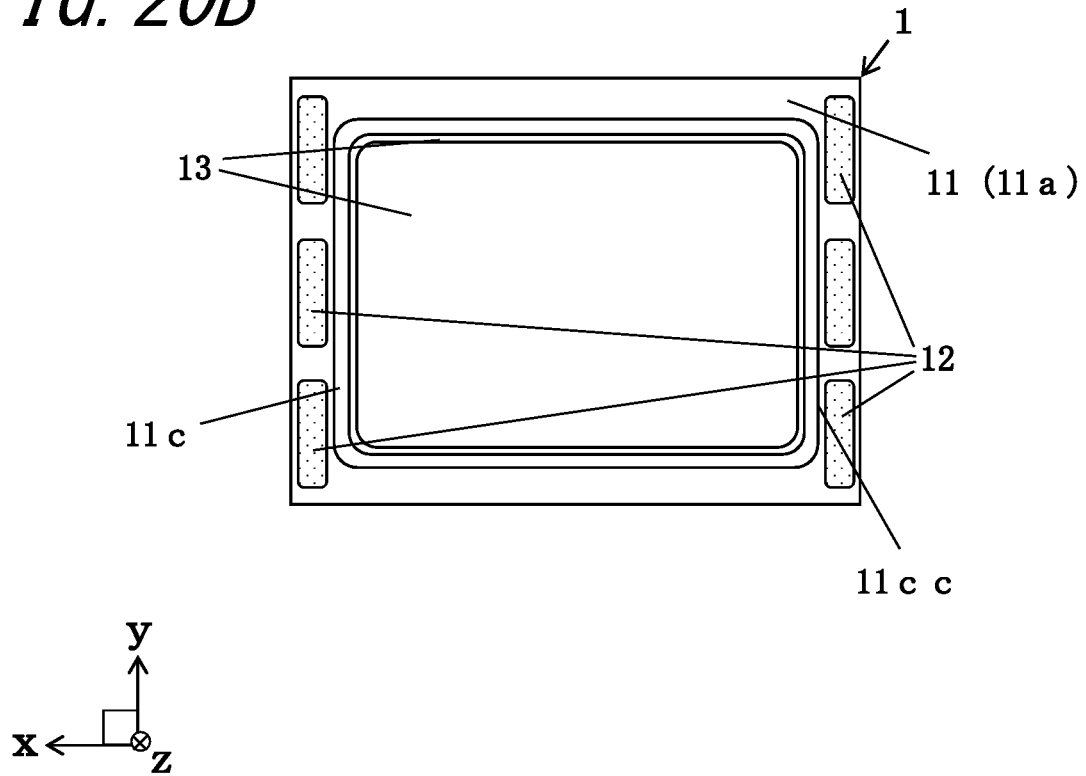
FIG. 20B is a bottom plan view of the wiring substrate shown in FIG. 20A.
Figure 21A:
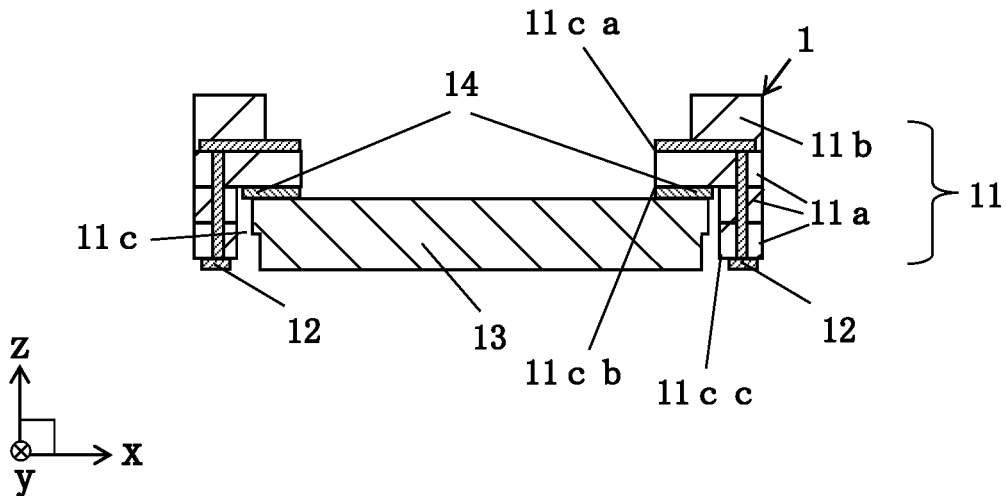
FIG. 21A is a sectional view of the wiring substrate taken along the line A-A shown in FIG. 20A.
Figure 21B:
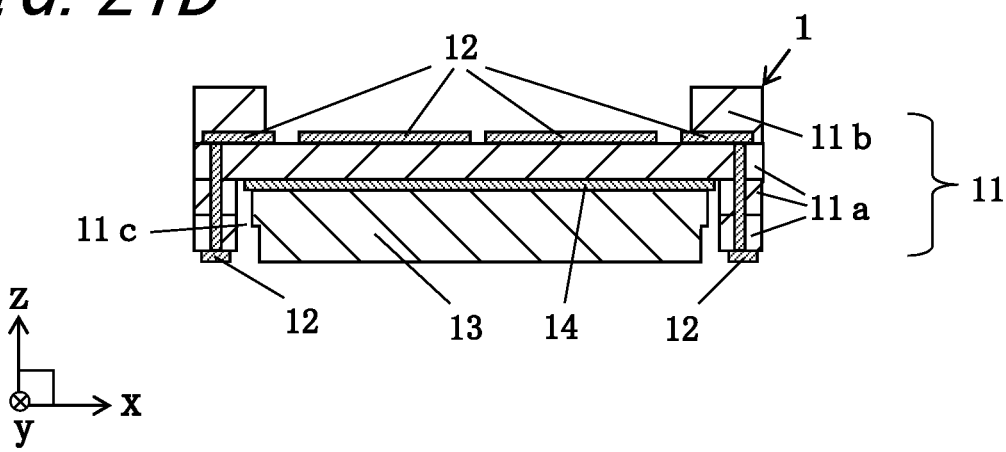
FIG. 21B is a view of a section along the line B-B of FIG. 20A.
Figure 21C:
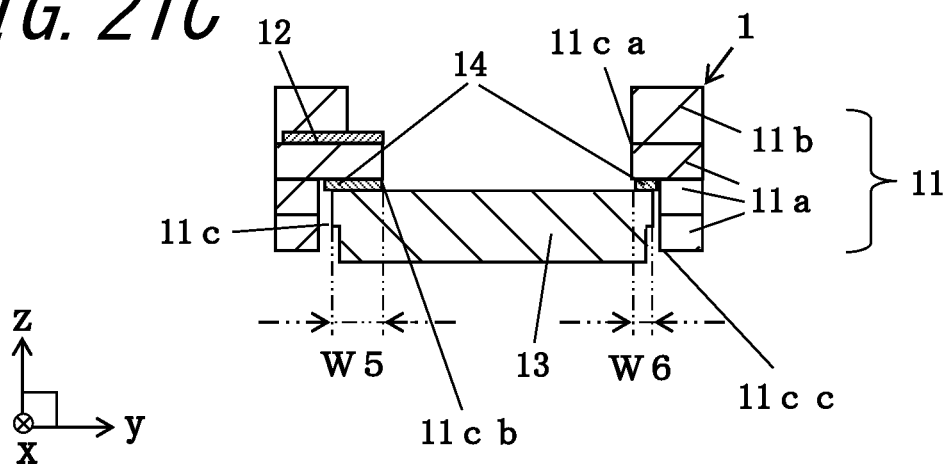
FIG. 21C is a view of a section along the line C-C of FIG. 20A.

In the example shown in FIGS. 20A and 20B, the plurality of wiring conductors 12 are each indicated by a shaded area.

In the example shown in FIG. 20A, in the transparent plan view, a part of overlap of the outer edge of the heat dissipator 13 and the frame portion 11b is indicated by a dotted line.

In the wiring substrate 1 according to the sixth embodiment, as in the wiring substrates 1 according to the preceding embodiments, the base portion 11a and the heat dissipator 13 can be joined together, the heat dissipator 13 can dissipate heat transmitted from the electronic element 2 mounted on the mounting face of the heat dissipator 13 properly through the lower surface and side surfaces of the heat dissipator 13, and the electronic element 2 mounted on the mounting face of the heat dissipator 13 can operate satisfactorily for long periods of time.

The wiring substrate 1 according to the sixth embodiment is effectively employed for cases where, for example, the upper surface of the base portion 11a needs to be provided with an increased number of the plurality of wiring conductors 12.

In the wiring substrate 1 according to this embodiment, as in the example shown in FIGS. 20A and 20B, the slit portion 12a is located at a position corresponding to the center of the one side of the first opening 11ca, as well as at the corner of the first opening 11ca. This permits distribution of heat from the plurality of wiring conductors 12 with respect to the slit portion 12a as a boundary. Thus, even if a local increase in heat liberation from the plurality of wiring conductors 12 occurs due to the offset or lopsided arrangement of a plurality of the wiring conductors 12 on the base portion 11a, heat is transmitted efficiently to the heat dissipator 13 which overlaps the plurality of wiring conductors as viewed in the transparent plan view, so that distortion of the base portion 11a around the edge of the first opening 11ca in which the plurality of wiring conductors 12 are located can be suppressed. Consequently, it is possible to obtain a compact and high-performance wiring substrate that enables the electronic element 2 to function satisfactorily during long-duration operation of the electronic element 2.

The disclosure is not limited to the described embodiments, and hence various changes and modifications may be made therein. For example, the base portion 11a or the frame portion 11b of the insulating substrate 11 may be made in a quadrangular form including beveled or chamfered sides or corners, as viewed in the plan view. Moreover, in a region ranging from the side surface of the base portion 11a to a certain location of the other principal surface, a cutout may be created for forming, on an inner surface thereof, a conductor which is connected to the wiring conductor 12, being called "castellation conductor".

In the wiring substrates 1 according to the first to sixth embodiments, in the vertical sectional view, the inner surface of the second through hole 11d of the frame portion 11b is perpendicular to the upper surface of the base portion 11a. As another design, the inner surface of the second through hole 11d of the frame portion 11b may be inclined so that, in the vertical sectional view, the second through hole 11d becomes wider on the opening side than on the upper surface side of the base portion 11a.

Moreover, in the wiring substrate 1 according to the first embodiment or the second embodiment, as in the wiring substrate 1 according to the third embodiment, the clearance between the inner surface of the through hole 11c and the side surface of the heat dissipator 13 in one region where the wiring conductor 12 lies around the third opening 11cc may be made greater than the clearance between the inner surface of the through hole 11c and the side surface of the heat dissipator 13 in the other region.

In the embodiments thus far described, the base portion 11a is formed of a three-ply insulating layer, whereas the frame portion 11b is formed of a single-ply insulating layer. As another design, the base portion 11a, as well as the frame portion 11b, may be formed of any of a single-ply insulating layer, a two-ply insulating layer, and three or more-ply insulating layer.

Moreover, the wiring substrate 1 according to each of the first to sixth embodiments may be implemented via a combination of the designs of some of other embodiments.

Moreover, the wiring substrate 1 may be produced in the form of a multi-piece substrate.

The invention claimed is:

1. A wiring substrate comprising:
   an insulating substrate including a base portion comprising a through hole having a first opening and a second opening, and a frame portion located on the base portion; and
   a heat dissipator disposed on a side of the base portion that is opposite to the frame portion so as to block the second opening,
   wherein an inner surface of the through hole faces a side surface of the heat dissipator with a clearance being provided between the inner surface of the through hole and the side surface of the heat dissipator, and
   in a cross section of the wiring substrate a first end and a second end of an upper surface of the heat dissipator are each attached to the base portion using a connection conductor, and the upper surface extends continuously along one straight line from the first end to the second end of the upper surface.

2. The wiring substrate according to claim 1,
   wherein the through hole has a third opening located opposite to the first opening, and
   in a vertical sectional view of the wiring substrate, the clearance between the inner surface of the through hole and the side surface of the heat dissipator is wider in a vicinity of the third opening than in a vicinity of the frame portion.

3. The wiring substrate according to claim 2,
   wherein the inner surface of the through hole that faces the side surface of the heat dissipator is inclined so that a diameter of the through hole increases gradually with increasing distance from the frame portion.

4. The wiring substrate according to claim 3,
   wherein the side surface of the heat dissipator that faces the inner surface of the through hole is stepped to provide a shoulder so that a width of the heat dissipator decreases with increasing distance from the frame portion.

5. The wiring substrate according to claim 2,
   wherein the side surface of the heat dissipator that faces the inner surface of the through hole is stepped to provide a shoulder so that a width of the heat dissipator decreases with increasing distance from the frame portion.

6. The wiring substrate according to claim 2,
   wherein, in a plan view of the wiring substrate, the clearance between the inner surface of the through hole and the side surface of the heat dissipator comprises different portions in adjacent side surfaces of the heat dissipator.

7. The wiring substrate according to claim 6,
   wherein a wiring conductor is disposed around the third opening, and
   in a plan view of the wiring substrate, in a region around the third opening, the clearance between the inner surface of the through hole and the side surface of the heat dissipator is wider in an area where the wiring conductor is disposed than in another area.

8. The wiring substrate according to claim 1, further comprising:
a plurality of wiring conductors placed on the base portion,
wherein the plurality of wiring conductors are located along an edge of the first opening as viewed in a plan view of the wiring substrate, and the plurality of wiring conductors overlap the heat dissipator as viewed in a transparent plan view of the wiring substrate.

9. The wiring substrate according to claim 8,
wherein the first opening is quadrangular in plan configuration.

10. The wiring substrate according to claim 9, further comprising:
a slit portion defined by a space between edges of neighboring wiring conductors of the plurality of wiring conductors.

11. The wiring substrate according to claim 10,
wherein, in a plan view of the wiring substrate, the plurality of wiring conductors are each located along a region which extends from one side of the first opening where the slit portion is contiguous to another side of the first opening that is contiguous to the one side, and the plurality of wiring conductors overlap the heat dissipator.

12. The wiring substrate according to claim 10,
wherein the slit portion is located at a position corresponding to a center of the one side of the first opening.

13. The wiring substrate according to claim 8, further comprising:
a slit portion defined by a space between edges of neighboring wiring conductors of the plurality of wiring conductors.

14. An electronic device, comprising:
the wiring substrate according to claim 1; and
an electronic element mounted on the wiring substrate.

15. An electronic module, comprising:
the electronic device according to claim 14; and
a module substrate to which the electronic device is connected.

16. The wiring substrate according to claim 1, wherein the insulating substrate has a laminated structure of ceramic sheets, and in the one cross section of the wiring substrate, an extension line of a lamination plane between the ceramic sheets and the one straight line are parallel.

17. The wiring substrate according to claim 16, wherein the heat dissipator is thicker than the ceramic sheet.

18. The wiring substrate according to claim 1, wherein in the cross section of the wiring substrate, a first surface of the heat dissipator and a second surface opposite to the first surface of the heat dissipator extend along the one straight line.

19. The wiring substrate according to claim 1, wherein in another cross section different from the cross section of the wiring substrate, the heat dissipator is continuously bonded to the base portion from the first end to the second end of the upper surface of the heat dissipator.

* * * * *